(12) United States Patent
Wu

(10) Patent No.: US 6,710,398 B2
(45) Date of Patent: Mar. 23, 2004

(54) SCALABLE STACK-TYPE DRAM MEMORY STRUCTURE AND ITS MANUFACTURING METHODS

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 0 days.

(21) Appl. No.: 10/200,248

(22) Filed: Jul. 23, 2002

(65) Prior Publication Data

US 2004/0016957 A1 Jan. 29, 2004

(51) Int. Cl.[7] .............................................. H01L 29/788
(52) U.S. Cl. ........................ 257/316; 257/320; 257/326
(58) Field of Search ................................. 257/296, 300, 257/314, 315, 316, 317, 319, 320, 326, 288; 438/255, 398

(56) References Cited

U.S. PATENT DOCUMENTS

| | | | | |
|---|---|---|---|---|
| 5,654,917 | A | * 8/1997 | Ogura et al. | 365/185.18 |
| 6,133,097 | A | * 10/2000 | Hsieh et al. | 438/266 |
| 6,133,098 | A | * 10/2000 | Ogura et al. | 438/267 |
| 6,248,633 | B1 | * 6/2001 | Ogura et al. | 438/267 |
| 6,297,525 | B1 | 10/2001 | Parekh et al. | |
| 6,329,684 | B1 | 12/2001 | Parekh et al. | |
| 6,352,896 | B1 | 3/2002 | Liu et al. | |

* cited by examiner

Primary Examiner—Phat X. Cao
Assistant Examiner—Theresa T. Doan
(74) Attorney, Agent, or Firm—Pro-Techtor International Services

(57) ABSTRACT

The scalable stack-type DRAM memory structure of the present invention comprises a scalable DRAM transistor structure and a scalable DRAM capacitor structure. The scalable DRAM transistor structure comprises a plurality of transistor-stacks, a plurality of common-drain regions, and a plurality of source regions being formed over a shallow-trench-isolation structure without a dummy-transistor structure by using a spacer-formation technique. The scalable DRAM capacitor structure comprises a plurality of rectangular tube-shaped cavities being formed over thin fourth conductive islands to form a high-capacity DRAM capacitor for each of DRAM cells; and a plurality of planarized conductive contact-islands over planarized third conductive islands being patterned and simultaneously etched with a plurality of bit-lines for forming a contactless DRAM memory. The cell size of a DRAM cell is scalable and can be made to be smaller than $6F^2$.

16 Claims, 15 Drawing Sheets

SCALABLE STACK-TYPE DRAM MEMORY STRUCTURE AND ITS MANUFACTURING METHODS

BACKGROUND OF THE INVENTION

1. Field of the Invention

The present invention relates generally to a DRAM memory cell and its manufacturing method and, more particularly, to a scalable stack-type DRAM memory structure and its manufacturing methods.

2. Description of Related Art

The dynamic-random-access memory (DRAM) cell including an access transistor and a storage capacitor has become the most important storage element in semiconductor industries, especially in computer and communication system. The memory density is increased very rapidly in order to decrease the cost per bit and, therefore, an advanced photolithography is in general needed to decrease the minimum-feature-size (F) of a cell.

In general, the output voltage of a DRAM memory cell is proportional to the capacitance value of the storage capacitor of the DRAM memory cell and, therefore, the storage capacitor must have a satisfactory capacitance value to have stable operation of the cell as the applied voltage is scaled. Basically, the storage capacitor can be implemented in a trench type or a stack type. The trench type is formed by forming a deep trench in a semiconductor substrate without increasing the surface area of the semiconductor-substrate surface; however, the deep-trench formation becomes very difficult as the minimum-feature-size is smaller than 0.15 $\mu$m. The stack type is formed by implementing a capacitor structure over the access transistor and its nearby dummy-transistor structure through the conductive contact-plug over the node diffusion region of the access transistor; however, the finite surface area over the access transistor becomes very difficult for forming a complicate capacitor structure as the minimum-feature-size is smaller than 0.15 $\mu$m. Accordingly, the limit cell size of the stack type is $8F^2$ for shallow-trench-isolation and, in general, the practical cell size is between $8F^2$ and $12F^2$. The limit cell size of the trench type is $6F^2$ for the excess transistor being formed over the semiconductor surface and, in general, the practical cell size is between $6F^2$ and $10F^2$.

A typical example of a stack-type DRAM memory is shown in FIG. 1, in which a pair of transistor-stacks 26 are formed over an active region including a common-drain diffusion region 27 and two common-source diffusion regions 25, 29, and a pair of dummy-transistors 24 are formed over the field-oxide layers 14 surrounding the active region. It is clearly seen that the alignment of the two dummy-transistors 24 to the edges of the active region is critical, the lateral dimension of the cell should be larger than 4F; the alignment of the bit-line contact 55 to the common-drain diffusion region 27 between a pair of sidewall dielectric spacers 30 is also critical, the space between two transistor-stacks needs to be larger than 1F; Similarly, the alignment of the node contact 54 is critical too, the space between the transistor-stack 26 and the dummy-transistor 24 needs to be larger than 1F. As a consequence, the cell size of FIG. 1 would be larger than $10F^2$ for isolation using local-oxidation of silicon (LOCOS), and these basic disadvantages can be easily found from most of the DRAM structure of the prior art, for examples: U.S. Pat. No. 6,297,525 B1, U.S. Pat. No. 6,329,684 B1, and U.S. Pat. No. 6,352,896 B1.

It is, therefore, a major objective of the present invention to offer a scalable stack-type DRAM memory structure without a dummy-transistor structure for obtaining a scalable cell size smaller than $6F^2$.

It is another objective of the present invention to offer a high-capacity DRAM capacitor structure without using a larger semiconductor surface area.

It is a further objective of the present invention to offer a contactless memory structure including both bit-line nodes and capacitor nodes to alleviate the scaling effects.

SUMMARY OF THE INVENTION

Accordingly, the present invention discloses a scalable stack-type DRAM memory structure and its manufacturing methods. The scalable stack-type DRAM memory structure of the present invention comprises a scalable DRAM transistor structure and a scalable DRAM capacitor structure. The scalable DRAM transistor structure of the present invention comprises a plurality of transistor-stacks being formed transversely to the plurality of STI regions and over a shallow-trench-isolation (STI) structure having a plurality of STI regions and a plurality of active regions formed alternately on a semiconductor substrate of a first conductivity type, wherein each of the plurality of transistor-stacks being formed by a spacer-formation technique comprises an elongated second conductive layer being formed over a flat surface alternately formed by a first conductive layer over a gate-dielectric layer in each of the plurality of active regions and a first raised field-oxide layer in each of the plurality of STI regions, a capping-dielectric layer being formed on the elongated second conductive layer, and a masking sidewall dielectric spacer being formed over the capping-dielectric layer; a plurality of common-source regions and a plurality of common-drain regions being formed alternately and transversely to the plurality of STI regions, wherein each of the plurality of common-source regions comprises two source regions separated by a self-aligned STI region being formed by another spacer-formation technique. Each of the plurality of common-drain regions being scalable comprises a second flat bed being formed alternately by a third raised field-oxide layer and a common-drain diffusion region of a second conductivity type, a plurality of planarized third conductive islands being formed between a pair of composite first sidewall dielectric spacers and on the common-drain diffusion regions, a first buffer-dielectric layer being formed over one sidewall of each of the plurality of transistor-stacks with a portion under each of a pair of first sidewall dielectric spacers, and a second planarized dielectric layer being formed between the planarized third conductive islands, wherein the common-drain diffusion region comprises a lightly-doped common-drain diffusion region being formed by implanting doping impurities across the first buffer-dielectric layer outside of first sidewall buffer-dielectric layers in a self-aligned manner and a shallow heavily-doped common-drain diffusion region being formed by implanting doping impurities in a self-aligned manner across the first buffer-dielectric layer outside of the pair of first sidewall dielectric spacers. The source region comprises a first flat bed being formed alternately by a third raised field-oxide layer and a source diffusion region of the second conductivity type, a second buffer-dielectric layer being formed over another sidewall of each of the plurality of transistor-stacks with a portion under each of a pair of second sidewall dielectric spacers, a thin fourth conductive island being formed over the source diffusion region between a composite second sidewall dielectric spacer and the first planarized dielectric layer being formed over said self-aligned STI region; and a third sidewall dielectric-spacer island being formed over each of the thin third conductive islands and between two second planarized dielectric layers formed over nearby STI regions, wherein the source diffusion region comprises a lightly-doped source diffusion region being formed by implanting doping impurities across the second buffer-dielectric layer outside of the second sidewall buffer-dielectric layer in a self-aligned manner and a shallow heavily-doped source diffusion region being formed by implanting doping impurities in a self-aligned manner across the second buffer-dielectric layer outside of the second sidewall dielectric spacer.

The DRAM capacitor structure of the present invention comprises a plurality of rectangular tube-shaped cavities being formed over the thin fourth conductive islands and a plurality of bit lines being integrated with the planarized third conductive islands through a plurality of planarized conductive contact-islands for forming a contactless bit-line node structure.

For a first-type DRAM capacitor structure, a first side of the rectangular tube-shaped cavity is formed by a composite first sidewall dielectric spacer, a second side being an opposite side of the first side is formed by a first planarized dielectric layer in the self-aligned STI region, and a third side and a fourth side are separately formed by a second planarized dielectric layer in the STI region. A fifth conductive layer is formed over an inner sidewall of the rectangular-tube-shaped cavity together the thin fourth conductive island being acted as a source plate, a capacitor-dielectric layer is formed at least over the source plate, and a sixth conductive layer or a planarized sixth conductive layer is formed over the capacitor-dielectric layer to act as a ground plate for forming a high-capacity DRAM capacitor structure.

For a second-type DRAM capacitor structure of the present invention, a first side of the rectangular tube-shaped cavity is formed by a composite first sidewall dielectric spacer and a first interlayer-conductive island over a first interlayer-dielectric island being formed on the nearby transistor-stack and a portion of the composite first sidewall dielectric spacer, a second side being an opposite side of the first side is formed by a third planarized dielectric layer over a first planarized dielectric layer in the self-aligned STI region, and a third side and a fourth side are separately formed by a fourth planarized dielectric layer over a second planarized dielectric layer in the STI region. A fifth conductive layer is formed over an inner sidewall of the rectangular tube-shaped cavity and an outer sidewall of the first interlayer-conductive island over a first interlayer-dielectric island together with the thin fourth conductive island being acted as a source plate, a capacitor-dielectric layer is formed at least over the source plate, and a sixth conductive layer or a planarized sixth conductive layer is formed over the capacitor-dielectric layer to act as a ground plate for forming a high-capacity DRAM capacitor structure.

The cell size of the DRAM memory structure as described is scalable and can be made to be smaller than $6F^2$ and the DRAM capacitor structure may offer a larger surface area for forming a high-capacity DRAM capacitor.

BRIEF DESCRIPTION OF THE DRAWINGS

FIG. 4A through FIG. 4F show the process steps and their cross-sectional views of fabricating a first-type DRAM capacitor structure of the present invention over the scalable DRAM transistor structure shown in FIG. 3K.

DETAILED DESCRIPTION OF THE PREFERRED EMBODIMENTS

Figure 1:
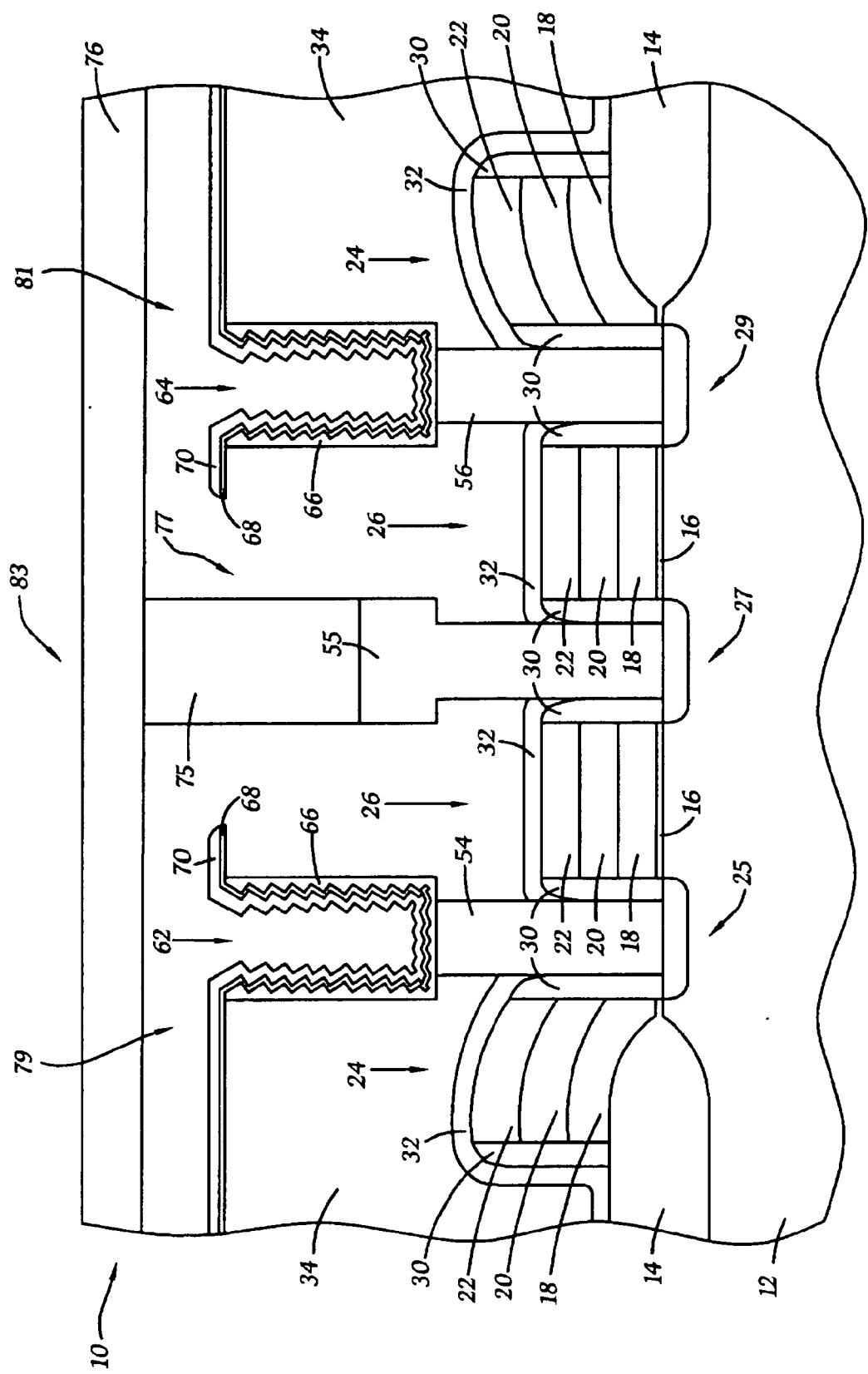
FIG. 1 shows a typical schematic diagram of a stack-type DRAM memory of the prior art.
Figure 2A:
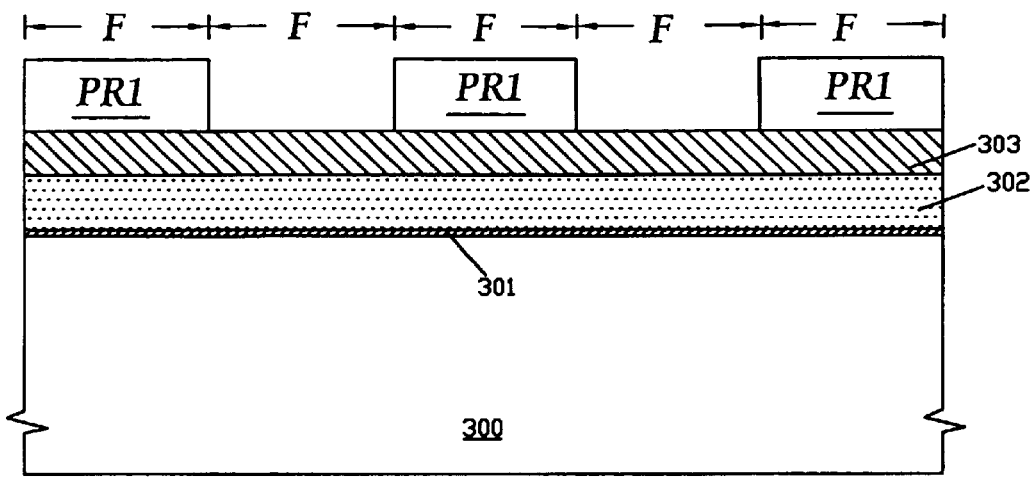
FIG. 2A through FIG. 2F show the process steps and their cross-sectional views of fabricating a shallow-trench-isolation structure for a scalable DRAM memory structure of the present invention.

Referring now to FIG. 2A through FIG. 2F, there are shown the process steps and their cross-sectional views of fabricating a shallow-trench-isolation (STI) structure for a scalable DRAM memory structure of the present invention. FIG. 2A shows that a gate-dielectric layer 301 is formed over a semiconductor substrate 300 of a first conductivity type; a first conductive layer 302 is then formed over the gate-dielectric layer 301; a first masking dielectric layer 303 is subsequently formed over the first conductive layer 302; and a plurality of masking photoresist PR1 are formed over the first masking dielectric layer 303 to define a plurality of active regions (under PR1) and a plurality of shallow-trench-isolation (STI) regions (outside of PR1). The gate-dielectric layer 301 is preferably a thermal-oxide layer or a nitrided thermal-oxide layer and its thickness is preferably between 15 Angstroms and 150 Angstroms. The first conductive layer 302 is preferably made of doped polycrystalline-silicon or doped amorphous-silicon as deposited by low-pressure chemical-vapor-deposition (LPCVD) and its thickness is preferably between 500 Angstroms and 2000 Angstroms. The first masking dielectric layer 303 is preferably made of silicon-nitride as deposited by LPCVD and its thickness is preferably between 500 Angstroms and 2000 Angstroms. The width and the space of the plurality of masking photoresist PR1 can be defined to be a minimum-feature-size (F) of technology used.

Figure 2B:
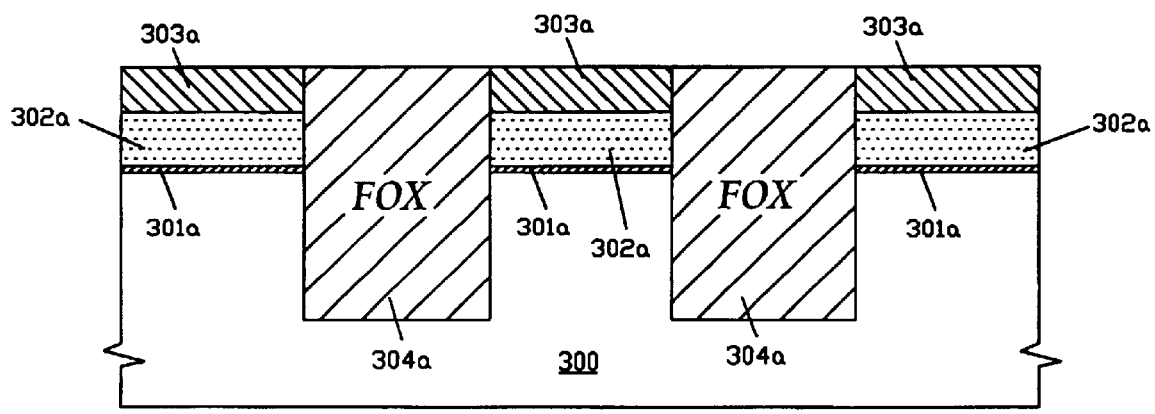

FIG. 2B shows that the first masking dielectric layer 303, the first conductive layer 302, and the gate-dielectric layer 301 outside of the plurality of masking photoresist PR1 are sequentially removed by using anisotropic dry etching; the semiconductor substrate 300 is then anisotropically etched to form the shallow trenches; and subsequently, the plurality of masking photoresist PR1 are stripped and then the planarized field-oxide layers 304a are formed over each gap formed by the shallow trenches. The depth of the shallow trenches in the semiconductor substrate 300 is preferably between 3000 Angstroms and 10000 Angstroms. The planarized field-oxide layers 304a are preferably made of silicon-dioxide, phosphosilicate glass (P-glass), or boro-phosphosilicate glass (BP-glass) as deposited by high-density plasma (HDP) CVD or plasma-enhanced (PE) CVD, and are formed by first depositing a thick-oxide film 304 to fill up the gaps formed by the shallow trenches and then planarizing the deposited thick-oxide film 304 by using chemical-mechanical-polishing (CMP) with the first masking dielectric layer 303a as a polishing stop.

Figure 2C:
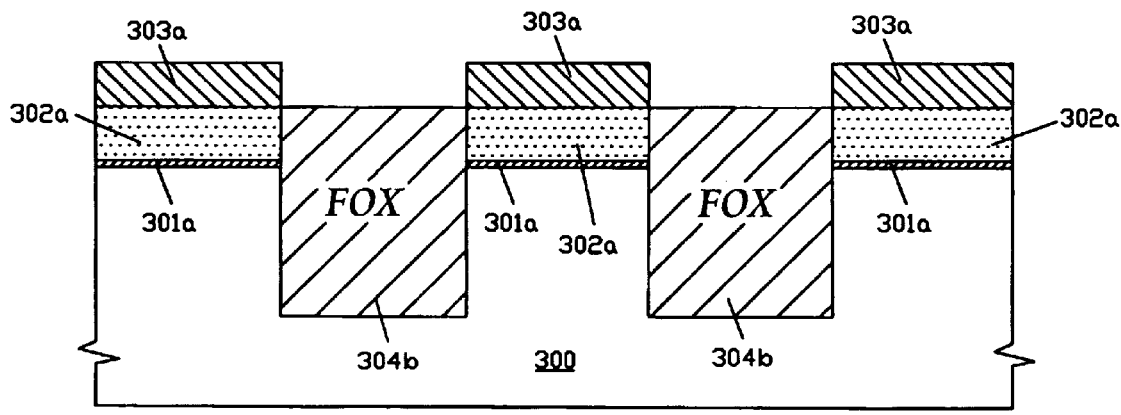

FIG. 2C shows that the planarized field-oxide layers 304a are selectively etched back to a depth equal to a thickness of the first masking dielectric layer 303a to form first raised field-oxide layers 304b.

Figure 2D:
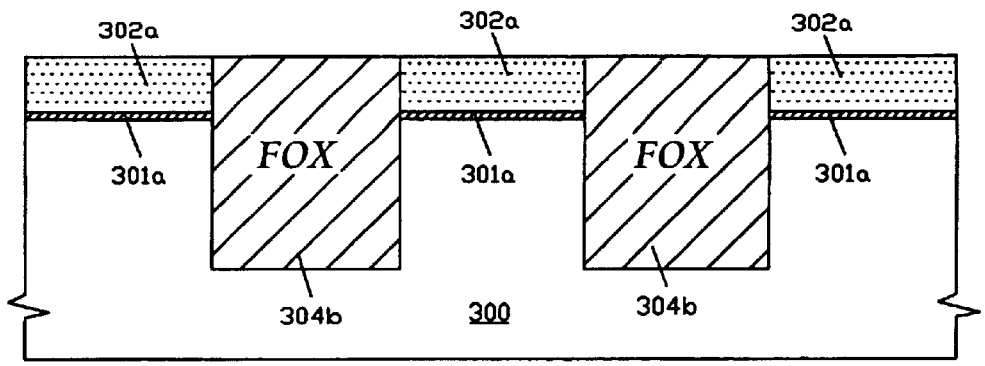

FIG. 2D shows that the first masking dielectric layers 303a are removed preferably by using hot-phosphoric acid or anisotropic dry etching to form a flat surface being alternately formed by the first raised field-oxide layer 304b and the first conductive layer 302a. It should be emphasized that a thermal oxidation process can be performed before forming the planarized field-oxide layers 304a to form a thin thermal-oxide layer over the trenched semiconductor surface for eliminating the trench-induced defects. Moreover, the flat surface shown in FIG. 2C can be obtained by using a silicon-oxide layer as the first masking dielectric layer 303 or without the first masking dielectric layer 303 as a polishing stop.

Figure 2E:
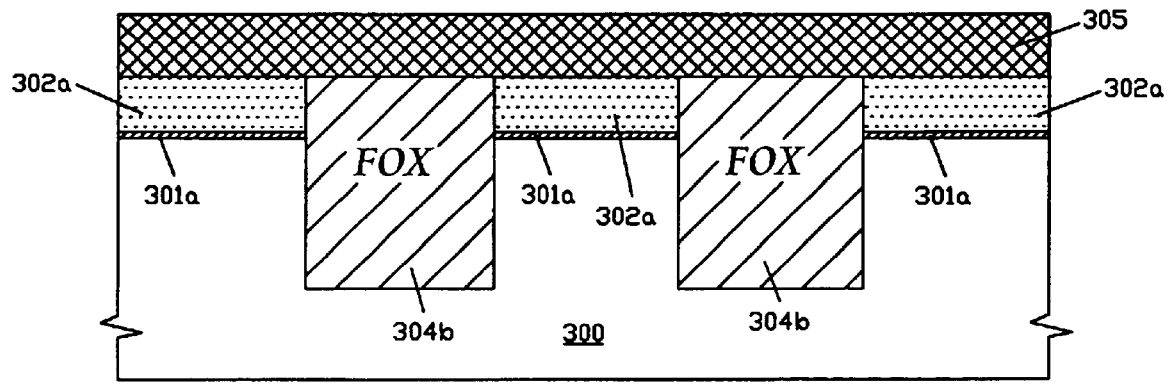

FIG. 2E shows that a second conductive layer 305 is formed over the flat surface shown in FIG. 2D. The second conductive layer 305 is preferably a tungsten-disilicide ($WSi_2$) layer or a tungsten (W) layer as deposited by LPCVD or sputtering and its thickness is preferably between 1500 Angstroms and 4000 Angstroms.

Figure 2F:
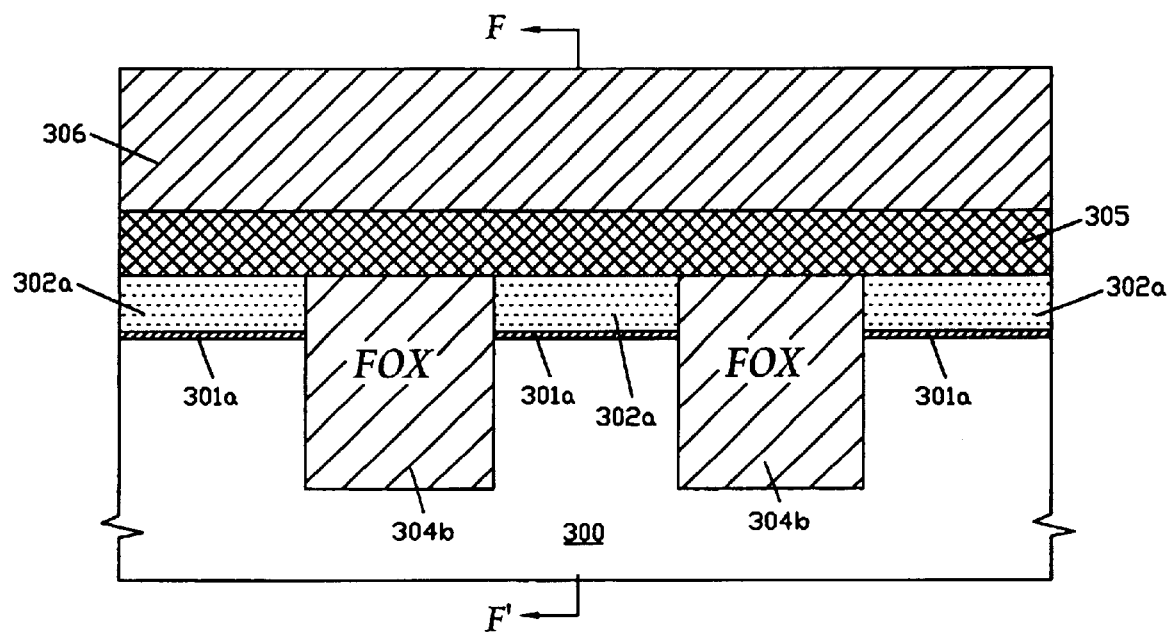

FIG. 2F shows that a second masking dielectric layer 306 is formed over the second conductive layer 305. The second masking dielectric layer 306 is preferably made of silicon-dioxide as deposited by LPCVD and its thickness is preferably between 2000 Angstroms and 10000 Angstroms. The cross-sectional view along an active region as indicated by the F-F' line is shown in FIG. 3A.

Figure 3A:
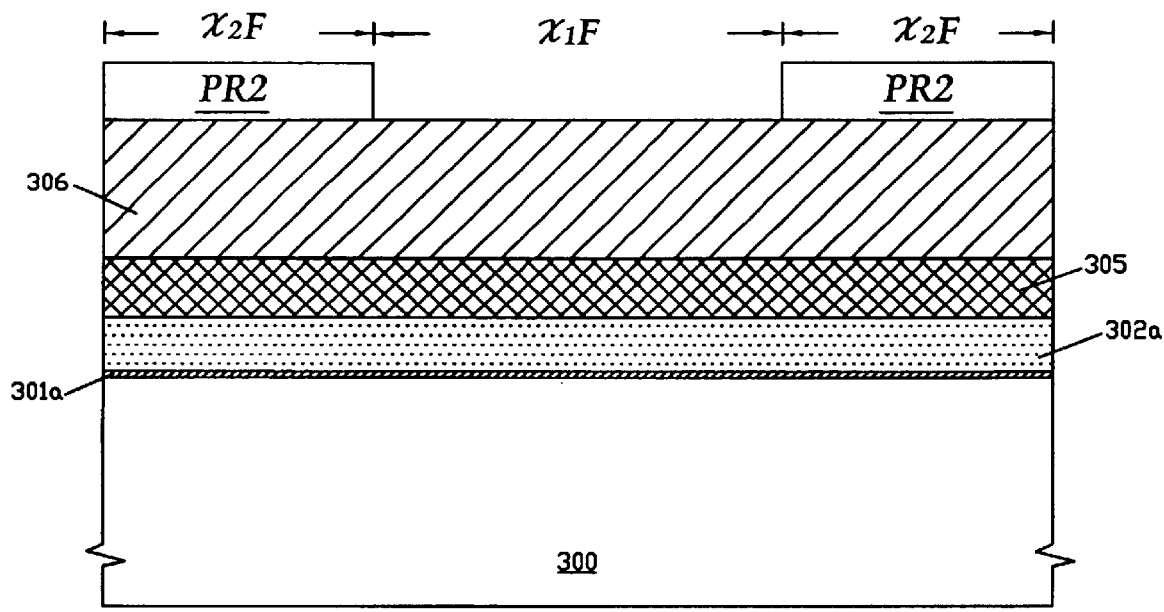
FIG. 3A through FIG. 3K show the process steps and their cross-sectional views of fabricating a scalable DRAM transistor structure of the present invention over the shallow-trench-isolation structure shown in FIG. 2F.

Referring now to FIG. 3A through FIG. 3K, there are shown the process steps and their cross-sectional views of fabricating a scalable DRAM transistor structure over a shallow-trench-isolation structure shown in FIG. 2F. FIG. 3A shows that a plurality of masking photoresist PR2 being formed transversely to the plurality of STI regions are formed over the second masking dielectric layer 306 to define the common-source regions (under PR2) as marked by $X_2F$ and the transistor-stack regions (between PR2) as marked by $X_1F$. It should be noted that each of the transistor-stack regions comprises two transistor-stacks and a common-drain region and is defined to be $X_1F$, the unit cell size of a DRAM cell is $(X_1+X_2) F^2$. If the transistor gate-length and the common-drain region are separately defined to be a minimum-feature-size (F) of technology used, $X_1$ is equal to 3; if the common-source region is defined to 3F ($X_2=3$), the unit cell size is equal to $6F^2$. It will be seen later that the common-source region and the transistor-stack region can be separately defined to be smaller than 3F and, therefore, the unit cell size of a DRAM cell can be made to be much smaller than $6F^2$.

Figure 3B:
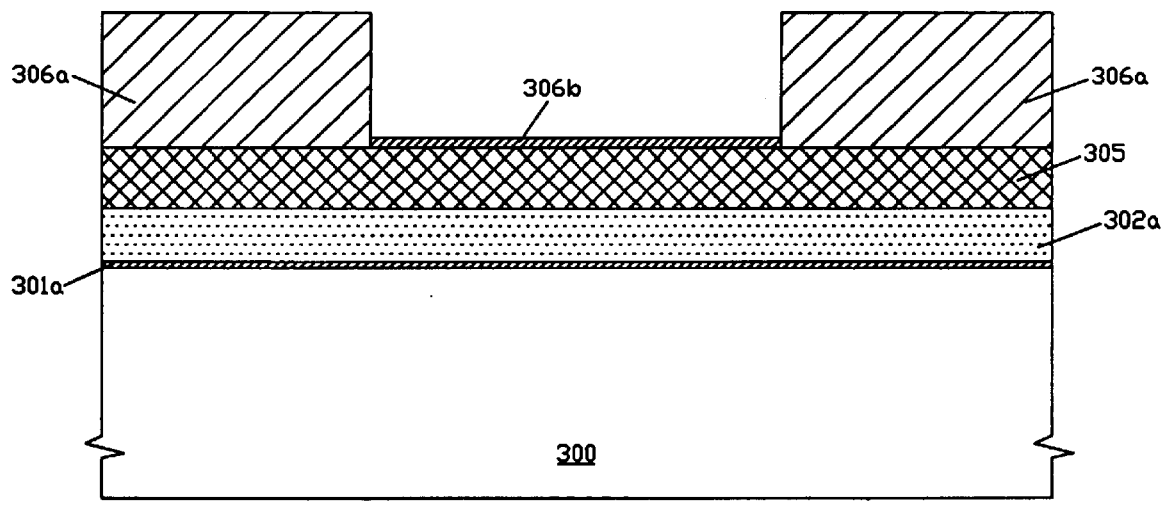

FIG. 3B shows that the second masking dielectric layer 306 outside of the plurality of masking photoresist PR2 are etched back by using anisotropic dry etching to form a capping-dielectric layer 306b over each of the transistor-stack regions. The thickness of the capping-dielectric layer 306b is preferably between 300 Angstroms and 1000 Angstroms.

Figure 3C:
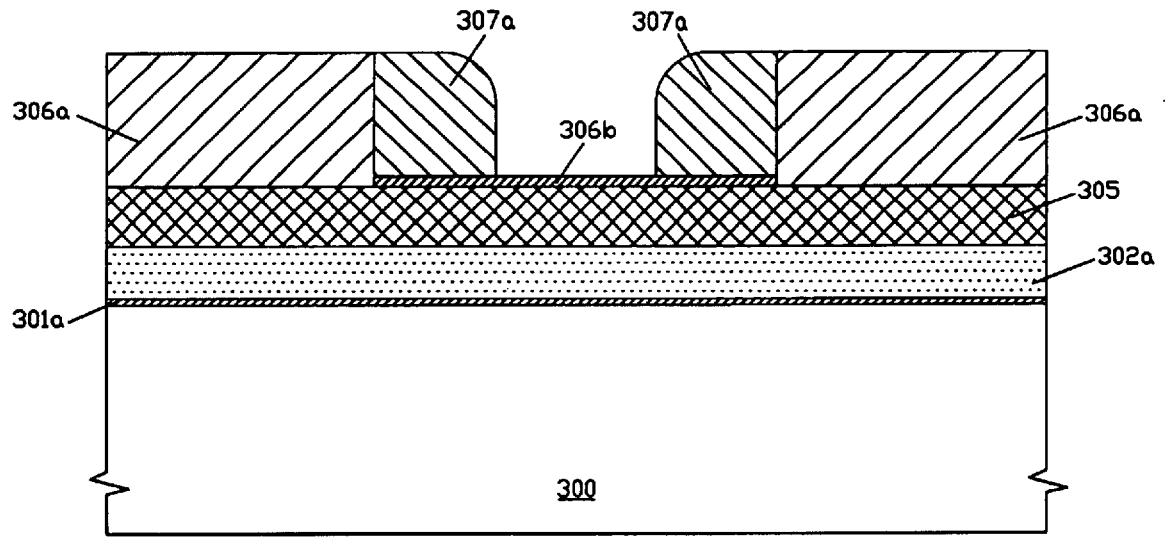

FIG. 3C shows a pair of masking sidewall dielectric spacers 307a are formed over each sidewall of the patterned second masking dielectric layers 306a and on a portion of the capping dielectric layer 306b in each of the transistor-stack regions. The masking sidewall dielectric spacer 307a is preferably made of silicon-nitride as deposited by LPCVD and is formed by first depositing a masking dielectric layer 307 over the patterned structure surface and then etching back a thickness of the deposited masking dielectric layer 307. It should be noted that the spacer width being equal to the thickness of the deposited masking dielectric layer 307 is used to define the gate length of the transistor-stacks and is therefore scalable.

Figure 3D:
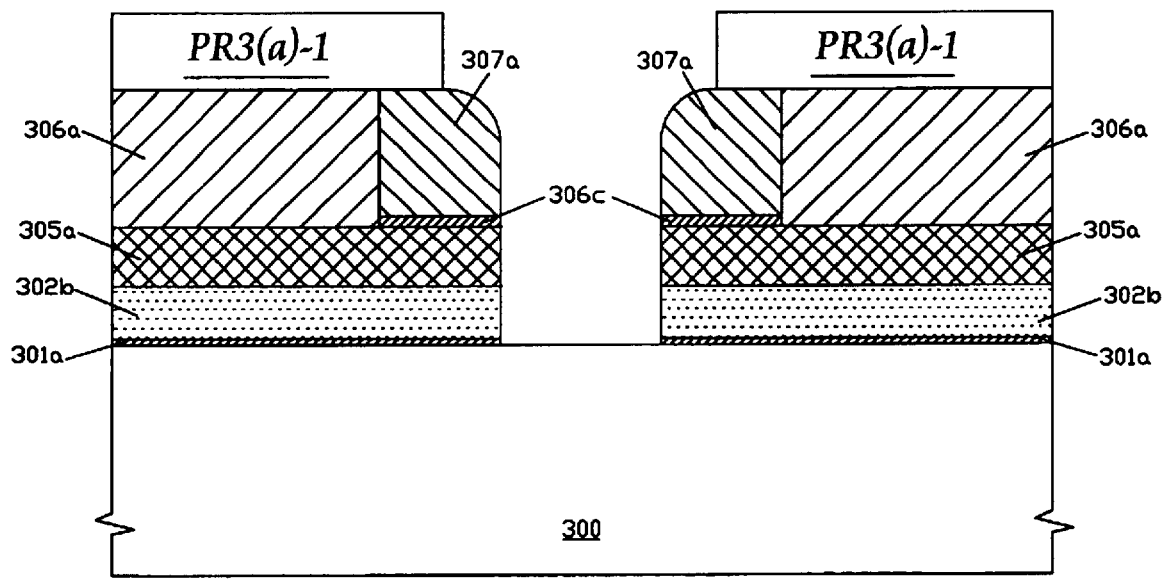

FIG. 3D shows a plurality of masking photoresist PR3 (a)-1 is formed over each of the common-source regions and a portion of nearby masking sidewall dielectric spacers 307a; the capping-dielectric layer 306b and the second conductive layer 305 outside of the pair of masking sidewall dielectric spacers 307a are sequentially removed by using anisotropic dry etching, the first raised field-oxide layers 304b are then etched back to a depth equal to a thickness of the first conductive layer 302a to form second raised field-oxide layers and subsequently the first conductive layers 302a are removed by using anisotropic dry etching; the gate-dielectric layer 301a is then removed by anisotropic dry etching or dipping in dilute hydrofluoric acid and the second raised field-oxide layers are simultaneously etched to form third raised field-oxide layers. It should be noted that a second flat bed is formed between the pair of masking sidewall dielectric spacers 307a and is alternately formed by the third raised field-oxide layer in each of the plurality of STI regions and the semiconductor substrate 300 in each of the plurality of active regions.

Figure 3E:
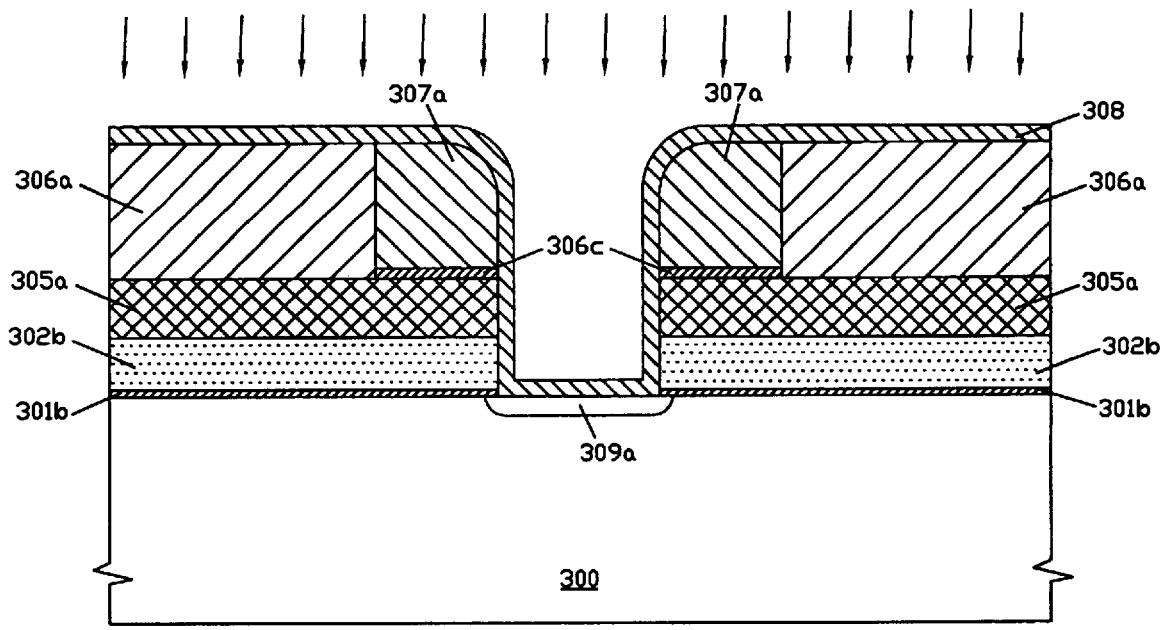

FIG. 3E shows that the plurality of masking photoresist PR3(a)-1 are stripped and a first buffer-dielectric layer 308 is formed over the formed structure, and an ion-implantation is performed by implanting doping impurities across the first buffer-dielectric layer 308 into the semiconductor substrate 300 to form lightly-doped common-drain diffusion regions 309a of a second conductivity type in a self-aligned manner. It is clearly seen that the first buffer-dielectric layer 308 provides an extending region for the lightly-doped common-drain diffusion regions 309a for reducing the overlapping region between the lightly-doped common-drain diffusion region 309a and the first conductive layer 302b. The first buffer-dielectric layer 308 is preferably made of silicon-nitride as deposited by LPCVD and its thickness is preferably between 100 Angstroms and 1000 Angstroms.

Figure 3F:
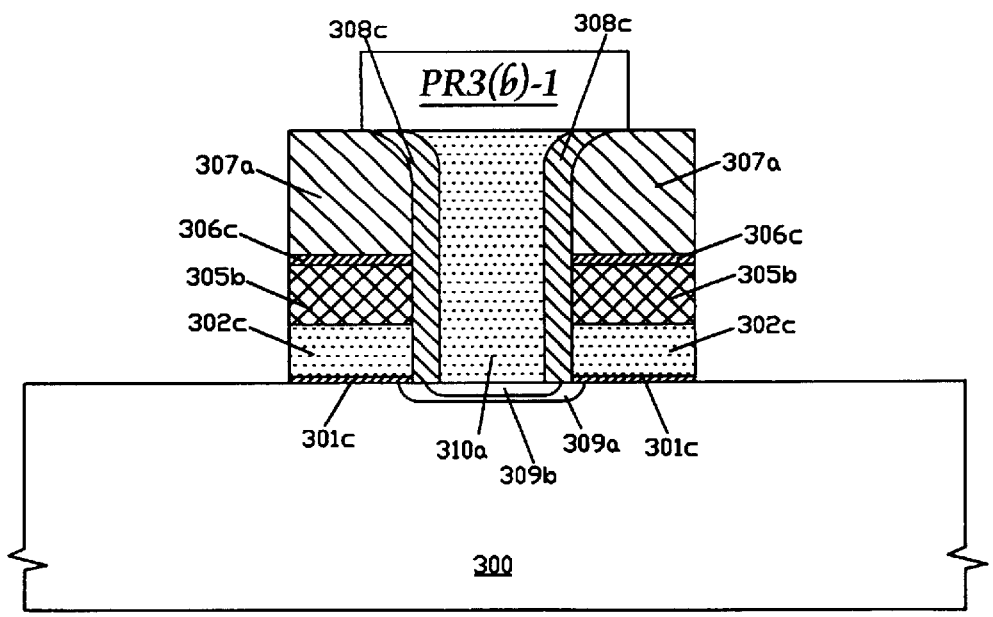

FIG. 3F shows that a first sidewall dielectric spacer is formed over each sidewall of the first buffer-dielectric layer 308 and is formed by first depositing a first dielectric layer 308d over the first buffer-dielectric layer 308 and then etching back a thickness of the deposited first dielectric layer 308d (not shown); an ion-implantation can be performed by implanting doping impurities across the first buffer-dielectric layer 308 outside of the pair of first sidewall dielectric spacers into the semiconductor substrate 300 to form shallow heavily-doped common-drain diffusion regions 309b of the second conductivity type within the lightly-doped common-drain diffusion regions 309a in a self-aligned manner; an etching back is then performed to remove the first buffer-dielectric layer 308 over the second masking dielectric layers 306a, the masking sidewall dielectric spacers 307a, and the second flat beds to form composite first sidewall dielectric spacers 308c as shown in FIG. 3F; and subsequently, a planarized third conductive layer 310a is formed between a pair of composite first sidewall dielectric spacers 308c and on each of the second flat beds. The first dielectric layer 308d is preferably made of silicon-nitride as deposited by LPCVD and its thickness is preferably between 100 Angstroms and 1000 Angstroms. Therefore, the composite first sidewall dielectric spacer 308c is made of silicon-nitride. The planarized third conductive layer 310a is preferably made of doped polycrystalline-silicon as deposited by LPCVD and is formed by first depositing a third conductive layer 310 to fill up each gap between the pair of composite first sidewall dielectric spacers 308c and then planarizing the deposited third conductive layer 310 using CMP with the masking sidewall dielectric spacer 307a as a polishing stop. FIG. 3F also shows that a plurality of masking photoresist PR3(b)-1 are formed over the planarized third conductive layers 310a and a portion of nearby transistor-stacks; the second masking dielectric layer 306a and the second conductive layers 305a outside of the plurality of masking photoresist PR3(b)-1 are sequentially removed by using anisotropic dry etching and then the first raised field-oxide layers 304b are etched back to a depth equal to a thickness of the first conductive layer 302b to form second raised field-oxide layers; and subsequently, the first conductive layers 302b are selectively removed, and the gate-dielectric layers 301b are then removed by anisotropic dry etching or dipping in dilute hydrofluoric acid and the second raised field-oxide layers are simultaneously etched to form third raised field-oxide layers. It should be noted that a first flat bed is formed between another pair of masking sidewall dielectric spacers 307a and is alternately formed by the third raised field-oxide layer and the semiconductor substrate 300 in each of the plurality of common-source regions. The plurality of masking photoresist PR3(b)-1 can be a reverse tone of the plurality of masking photoresist PR3(a)-1 using the same photo-mask.

Figure 3G:
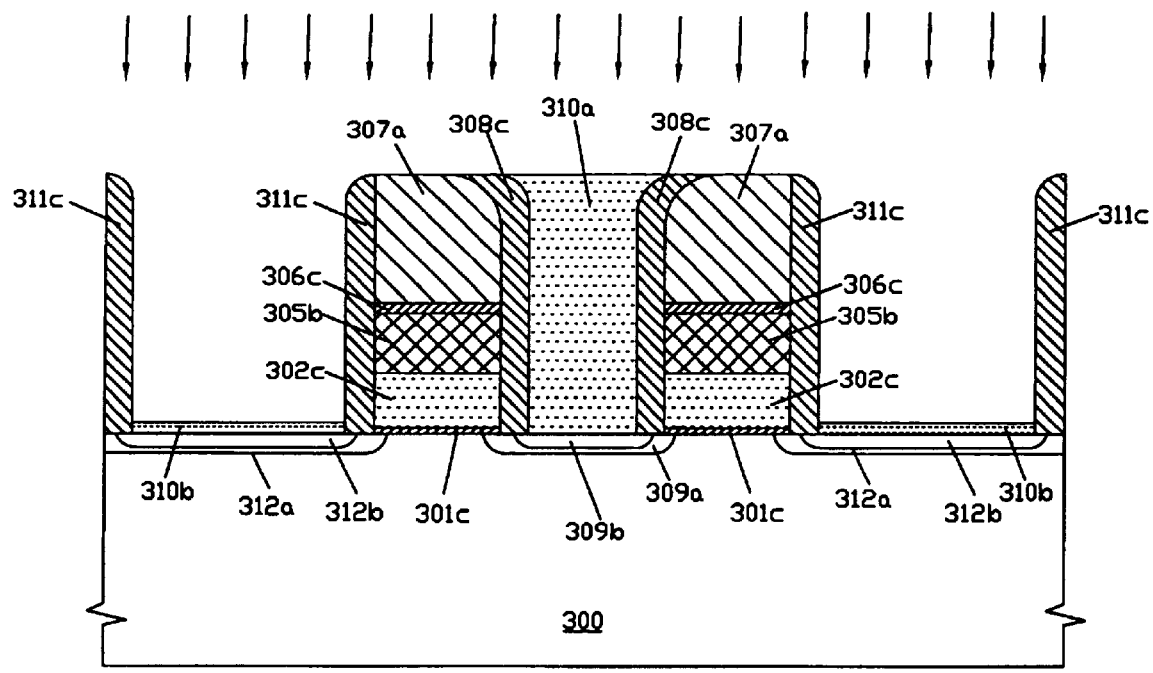

FIG. 3G shows that the plurality of masking photoresist PR3(b)-1 are stripped, a pair of composite second sidewall dielectric spacers 311c are then formed in each of the common-source regions by using the same processes of forming the pair of composite first sidewall dielectric spacers 308c, and lightly-doped common-source diffusion regions 312a of the second conductivity type and shallow heavily-doped common-source diffusion regions 312b of the second conductivity type are formed; a planarized fourth conductive layer (not shown) is formed between the pair of composite second sidewall dielectric spacers 311c and on the second flat bed in each of the common-source regions, and a plurality of masking photoresist PR3(b)-2 (not shown) are formed over the same position as the plurality of masking photoresist PR3(b)-1, the planarized fourth conductive layers are then etched back to form thin fourth conductive layers 310b as shown in FIG. 3G, and an ion-implantation is performed to heavily dope the thin fourth conductive layers 310b and the planarized third conductive layers 310a after stripping the plurality of masking photoresist PR3(b)-2. The thin fourth conductive layer 310b is preferably made of doped polycrystalline-silicon as deposited by LPCVD and its thickness is preferably between 100 Angstroms and 1000 Angstroms. It should be noted that the plurality of masking photoresist PR3(b)-2 are not needed if the planarized third conductive layers 310a are oxidized to form a capping poly-oxide layer before forming the plurality of masking photoresist PR3(b)-1.

Figure 3H:
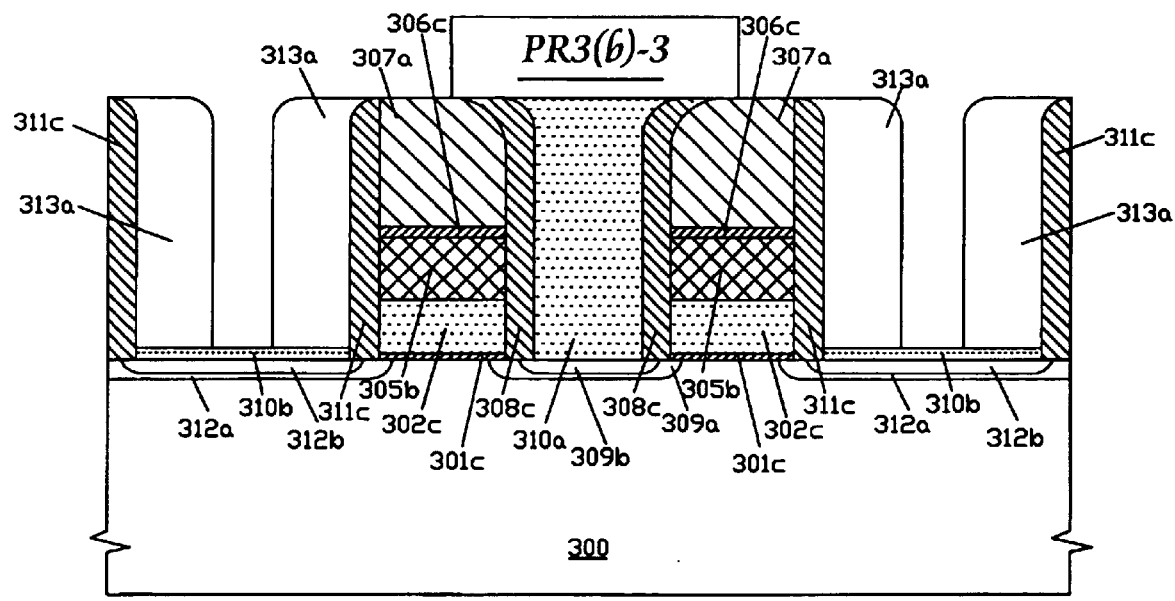

FIG. 3H shows that a pair of third sidewall dielectric spacers 313a are formed over the pair of composite second sidewall dielectric spacers 311c and on a portion of the thin fourth conductive layer 310b in each of the common-source regions and a plurality of masking photoresist PR3(b)-3 are formed over the same position as the plurality of masking photoresist PR3(b)-1 by using the same photo-mask. Similarly, the plurality of masking photoresist PR3(b)-3 are not needed if a capping poly-oxide layer is formed over each of the planarized third conductive layers 310a. The third sidewall dielectric spacer 313a is preferably made of doped oxides as deposited by LPCVD and its spacer width is used to define each source region of nearby transistor-stacks and to simultaneously determine the width of an isolation region between the source regions. It should be noted that for later figures and discussion, the planarized third conductive layer 310a comprises a planarized doped polycrystalline-silicon layer or a planarized doped polycrystalline-silicon layer capped with a capping poly-oxide layer.

Figure 3I:
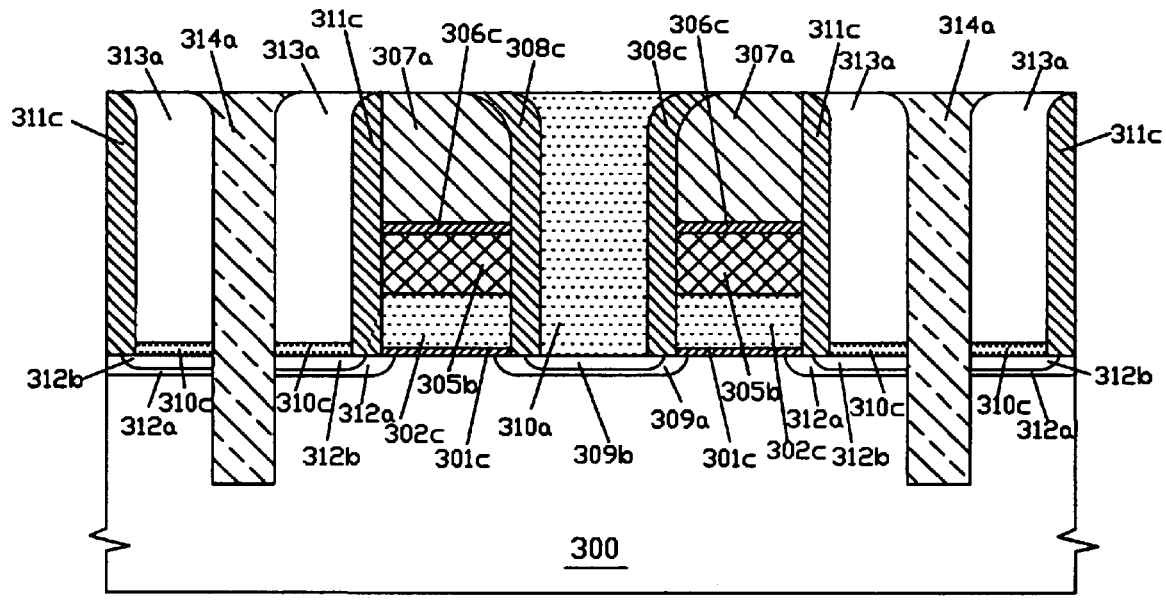

FIG. 3I shows that the thin fourth conductive layers 310b between the pair of third sidewall dielectric spacers 313a are removed by anisotropic dry etching and the semiconductor substrate 300 in the active regions are anisotropically etched in a self-aligned manner to form a plurality of self-aligned shallow trenches, and a first planarized dielectric layer 314a is formed to fill up each gap between the pair of third sidewall dielectric spacers 313a. The depth of the plurality of self-aligned shallow trenches in the semiconductor substrate 300 is preferably between 3000 Angstroms and 10000 Angstroms. The first planarized dielectric layer 314a is preferably made of silicon-oxynitride or silicon-dioxide as deposited by LPCVD. It should be noted that a thermal oxidation process can be performed to form a thin thermal-oxide layer over the trenched semiconductor surface to eliminate the trench-induced defects before depositing the first planarized dielectric layers 314a.

Figure 3J:
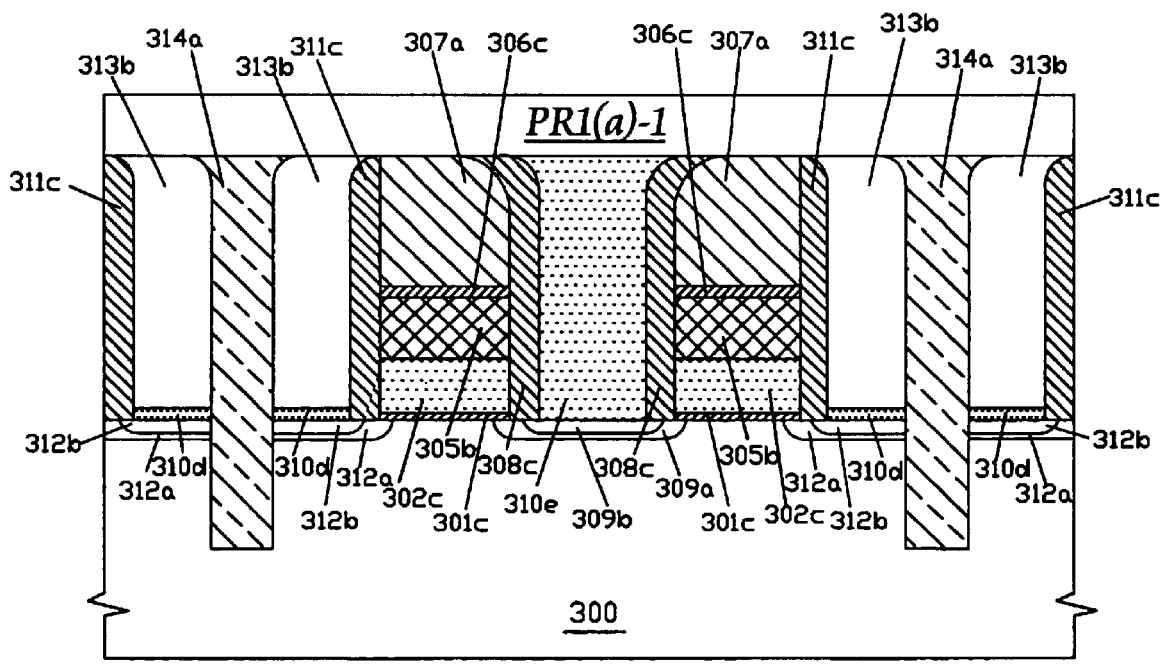

FIG. 3J shows that a plurality of masking photoresist PR1(a)-1 being aligned to the plurality of active regions are formed over a planarized structure surface shown in FIG. 3I, and the planarized third conductive layers 310a, the pair of third sidewall dielectric spacers 313a, and the thin fourth conductive layers 310c outside of the plurality of masking photoresist PR1(a)-1 are sequentially removed to form planarized third conductive islands 310e, a pair of third sidewall dielectric-spacer islands 313b, and thin fourth conductive islands 310d by using anisotropic dry etching. The plurality of masking photoresist PR1(a)-1 can be patterned by using the same photo-mask for forming the plurality of masking photoresist PR1.

Figure 3K:
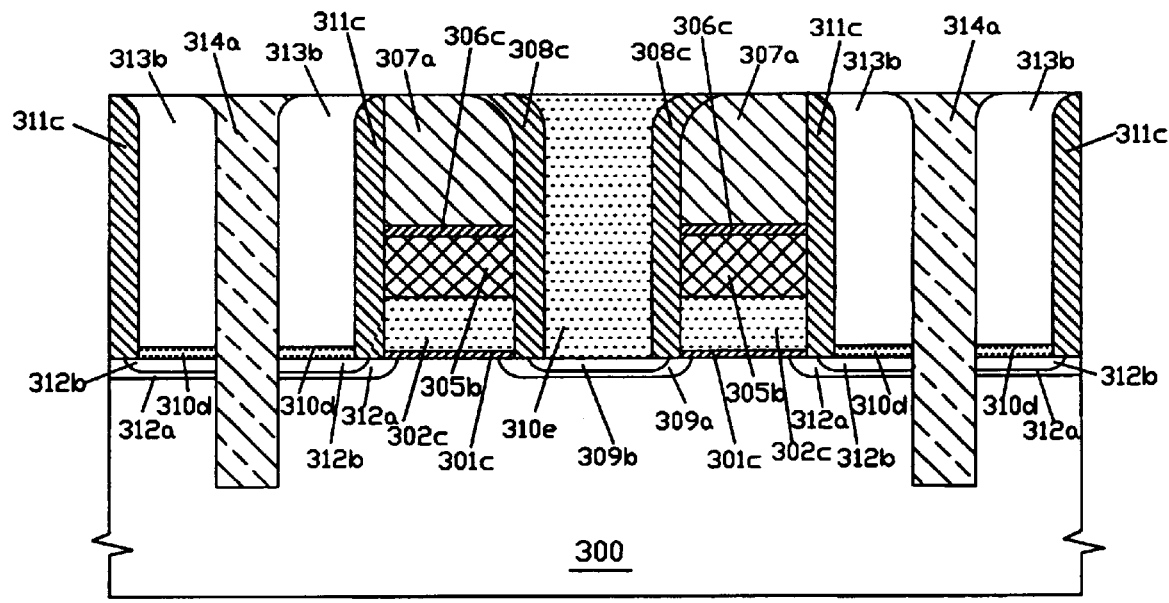

FIG. 3K shows that the plurality of masking photoresist PR1(a)-1 are stripped and second planarized dielectric layers are formed to fill up the gaps formed between the plurality of active regions to form a scalable DRAM transistor structure of the present invention. The second planarized dielectric layer is preferably made of silicon-oxynitride or silicon-dioxide as deposited by LPCVD. It should be emphasized that the third sidewall dielectric-spacer island 313b is surrounded by the first planarized dielectric layer 314a, the second planarized dielectric layers, and the composite second sidewall dielectric spacers 311c and can be selectively removed to form the rectangular tube-shaped cavity for forming a scalable DRAM capacitor structure of the present invention.

From FIG. 3K, it is clearly seen that the source region, the self-aligned shallow-trench region, the transistor-stack region, and the common-drain region along the active region are formed by the spacer-formation technique and can be made to be smaller than a minimum-feature-size (F) of technology used. Therefore, the cell size of a DRAM memory cell can be made to be smaller than $6F^2$.

Figure 4A:
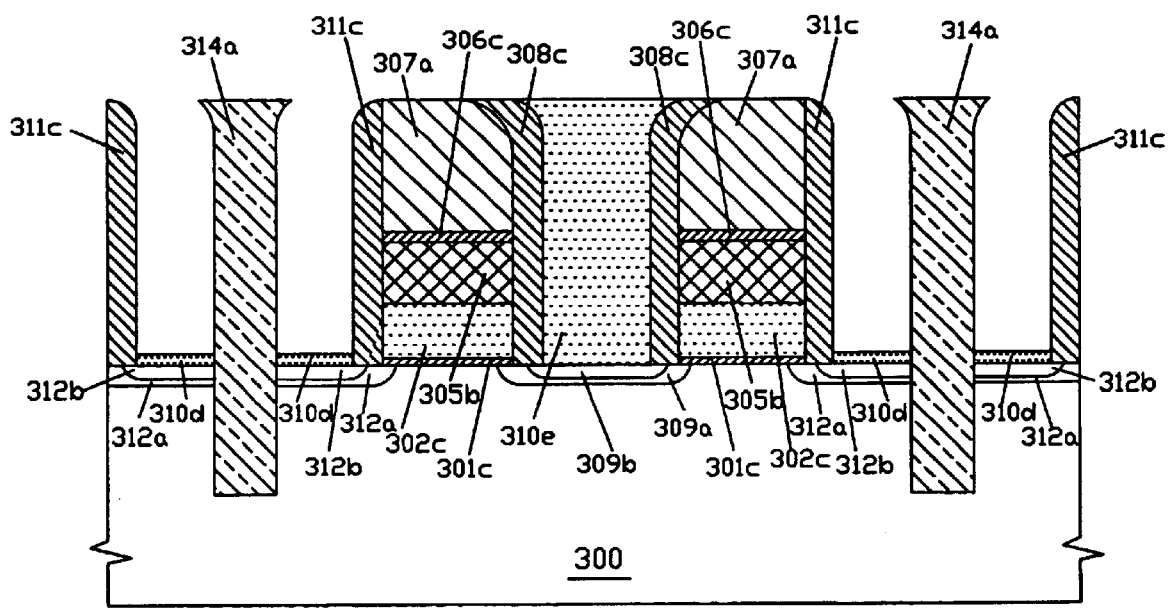

Referring now to FIG. 4A through FIG. 4E, there are shown the process steps and their cross-sectional views of fabricating a first-type DRAM capacitor structure of the present invention over the scalable DRAM transistor structure shown in FIG. 3K. FIG. 4A shows that the third sidewall dielectric-spacer islands 313b are selectively removed by first using anisotropic dry etching and then wet etching to form the rectangular tube-shaped cavity over each of the thin fourth conductive islands 310d.

Figure 4B:
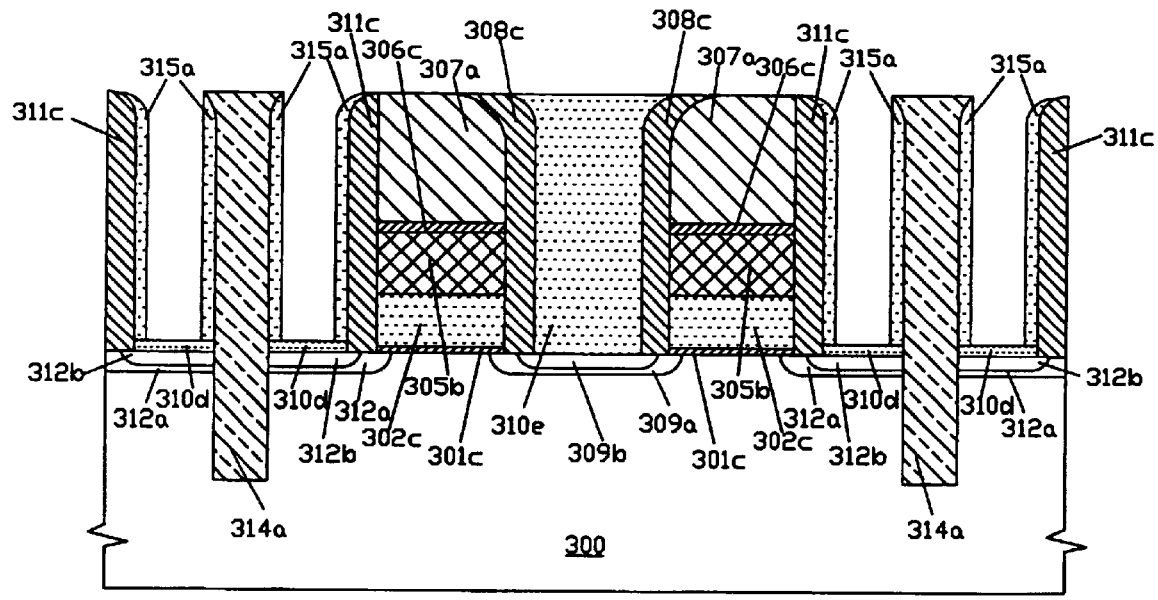

FIG. 4B shows that a fifth conductive layer 315 is formed over the formed structure shown in FIG. 4A and is etched back to a thickness of the deposited fifth conductive layer 315 to form a source plate 315a, 310d for each of DRAM cells. The fifth conductive layer 315 is preferably made of doped or undoped polycrystalline-silicon or is preferably a rugged polycrystalline-silicon layer such as a hemispherical-grain (HSG) polycrystalline-silicon or cylindrical-grain polycrystalline-silicon layer.

Figure 4C:
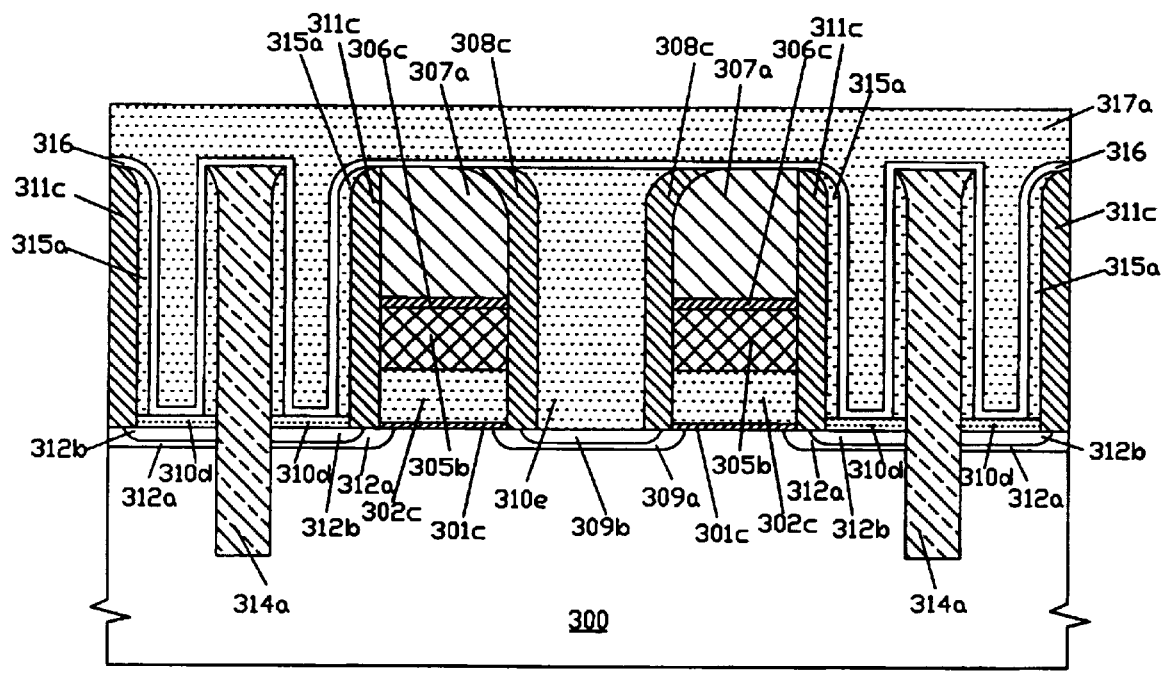

FIG. 4C shows that a capacitor-dielectric layer 316 is formed over the whole structure and a planarized sixth conductive layer 317a or a sixth conductive layer 317 (not shown) is formed over the capacitor-dielectric layer 316. The capacitor-dielectric layer 316 is preferably a high dielectric-constant (high K) insulator. The planarized sixth conductive layer 317a or the sixth conductive layer 317 is preferably made of doped polycrystalline-silicon or doped polycrystalline-silicon capped with a refractory metal-silicide layer.

Figure 4D:
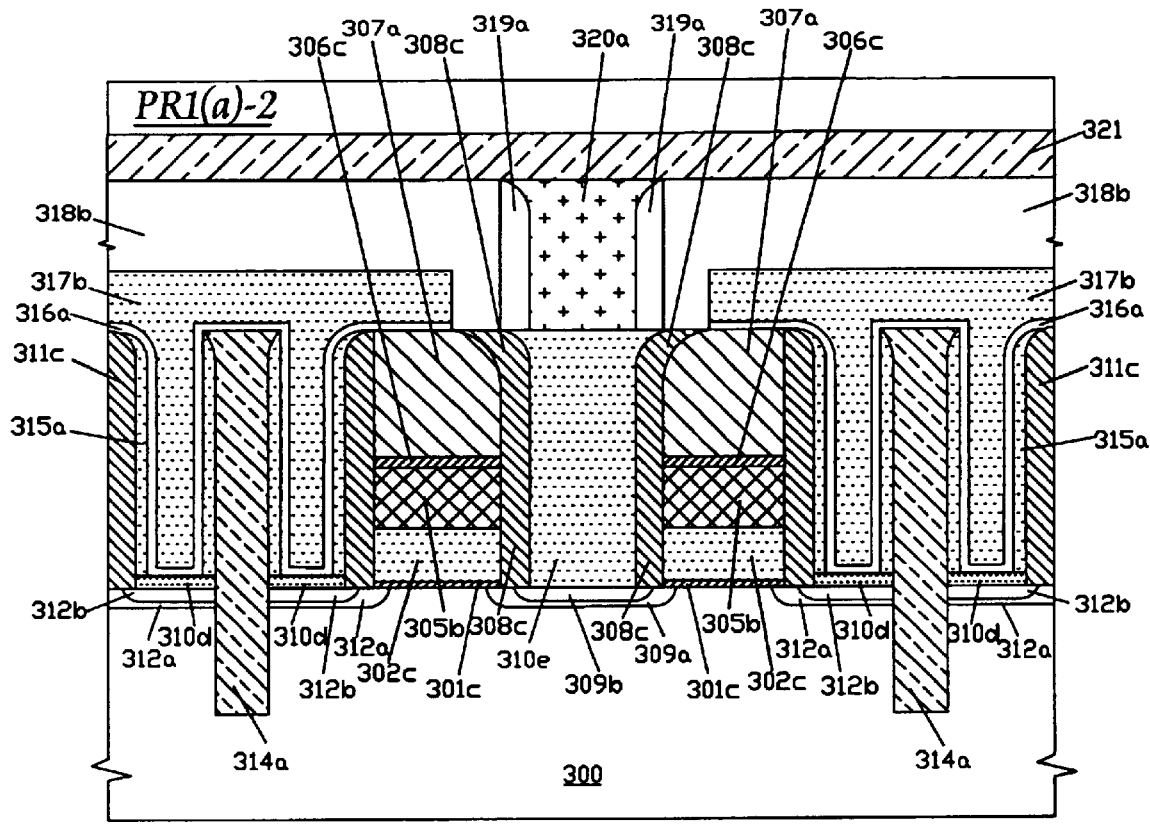

FIG. 4D shows that the planarized sixth conductive layer 317a or the sixth conductive layer 317 (not shown) is patterned by a plurality of masking photoresist PR3(a)-2 (not shown) to form a plurality of capacitor plates 317b and a planarized interlayer-dielectric layer 318a is formed over the whole structure surface; a plurality of masking photoresist PR4 (not shown) are formed over the planarized interlayer-dielectric layer 318a to pattern and etch a drain-contact trench over each of the common-drain regions and a pair of sidewall dielectric spacers 319a are then formed over each sidewall of the drain-contact trenches; and subsequently, a planarized first metal layer 320a is formed over the planarized third conductive islands 310e without the capping poly-oxide layers or with the capping poly-oxide layers being removed and the second planarized dielectric layers between the pair of sidewall dielectric spacers 319a, and a second metal layer 321 is then formed over the planarized interlayer-dielectric layer 318b, the pair of sidewall dielectric spacers 319a, and the planarized first metal layers 320a; and a plurality of masking photoresist PR1(a)-2 being aligned to the plurality of active regions are formed over the second metal layer 321. The plurality of masking photoresist PR3(a)-2 can be patterned by the same photo-mask used by the plurality of masking photoresist PR3(a)-1. The planarized interlayer-dielectric layer 318a is preferably made of silicon-dioxide, P-glass, or BP-glass as deposited by HDPCVD or PECVD. The sidewall dielectric spacer 319a is preferably made of silicon-oxide or silicon-nitride as deposited by LPCVD. The planarized first metal layer 320a is preferably a planarized tungsten (W) layer lined with a barrier-metal layer such as a titanium-nitride (TiN) or tantalum-nitride (TaN) layer. The second metal layer 321 is preferably made of aluminum or copper. The plurality of masking photoresist PR1(a)-2 can be patterned by the same photo-mask used for the plurality of masking photoresist PR1.

Figure 4E:
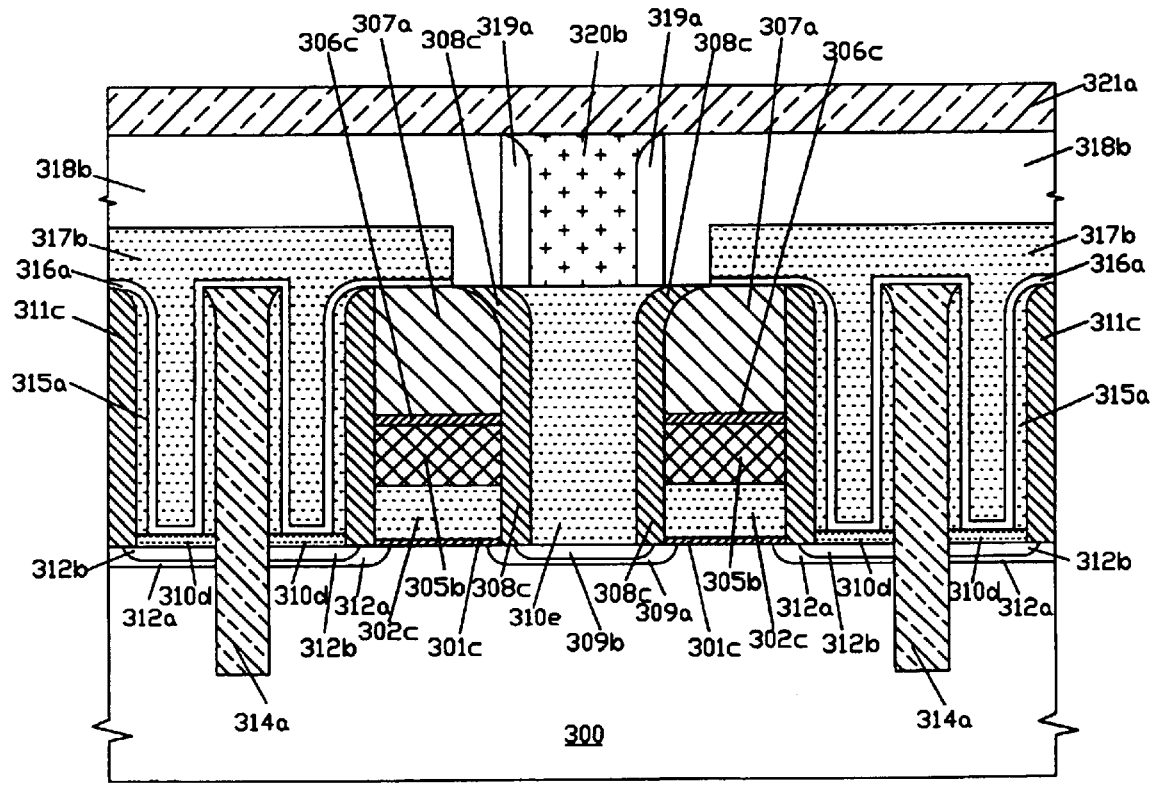

FIG. 4E shows that the second metal layer 321 and the planarized first metal layers 320a outside of the plurality of masking photoresist PR1(a)-2 are removed by using anisotropic dry etching to form a plurality of bit-lines 321a integrated with a plurality of planarized first-metal islands 320b to form a first-type DRAM capacitor structure of the present invention.

Figure 5A:
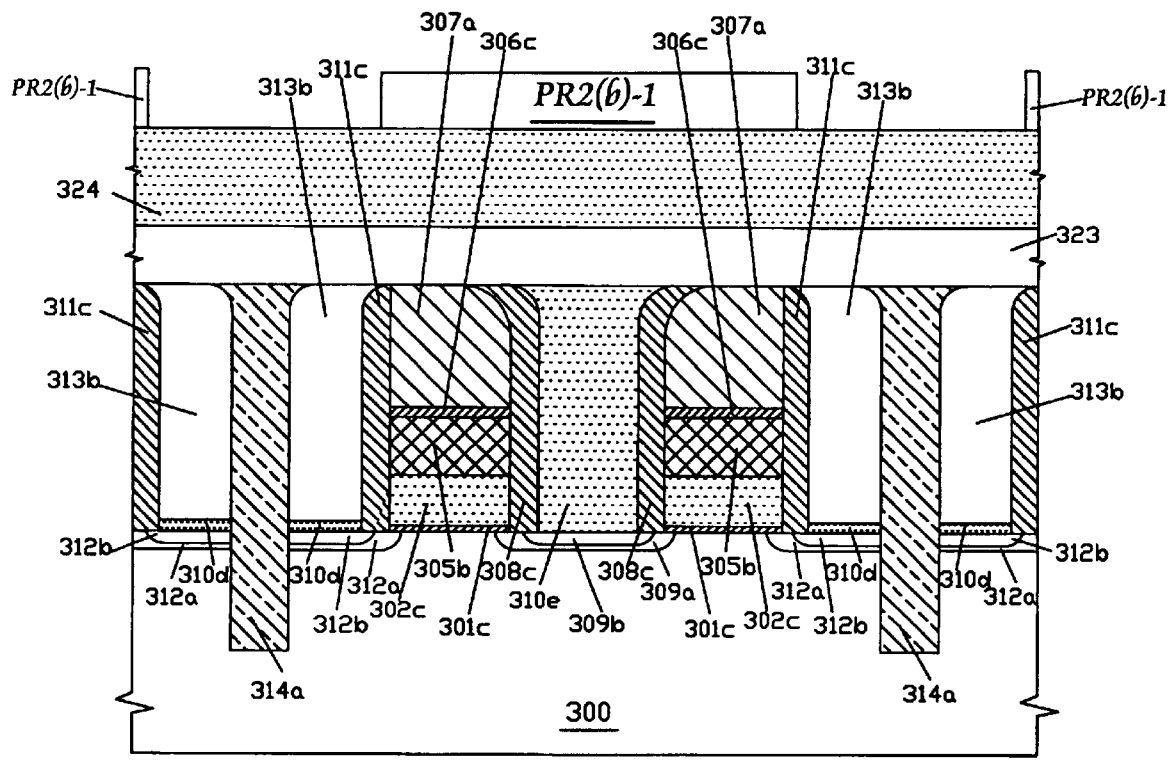
FIG. 5A through FIG. 5F show the process steps and their cross-sectional views of fabricating a second-type DRAM capacitor structure of the present invention over the scalable DRAM transistor structure shown in FIG. 3K.

Referring now to FIG. 5A through FIG. 5F, there are shown the process steps and their cross-sectional views of fabricating a second-type DRAM capacitor structure of the present invention over a scalable DRAM transistor structure shown in FIG. 3K. FIG. 5A shows a first interlayer-dielectric layer 323 and a first interlayer-conductive layer 324 are sequentially formed over the scalable DRAM transistor structure shown in FIG. 3K and a plurality of masking photoresist PR2(b)-1 are formed over the first interlayer-conductive layer 324 to pattern and etch a plurality of common-source trenches over each of the common-source regions. The first interlayer-dielectric layer 323 is preferably made of silicon-oxide or silicon-nitride as deposited by LPCVD, HDPCVD, or PECVD and its thickness is preferably between 5000 Angstroms and 15000 Angstroms. The first interlayer-conductive layer 324 is preferably made of doped or undoped polycrystalline-silicon as deposited by LPCVD and its thickness is preferably between 5000 Angstroms and 20000 Angstroms. The plurality of masking photoresist PR2(b)-1 can be patterned by the same photo-mask used to pattern the plurality of masking photoresist PR2.

Figure 5B:
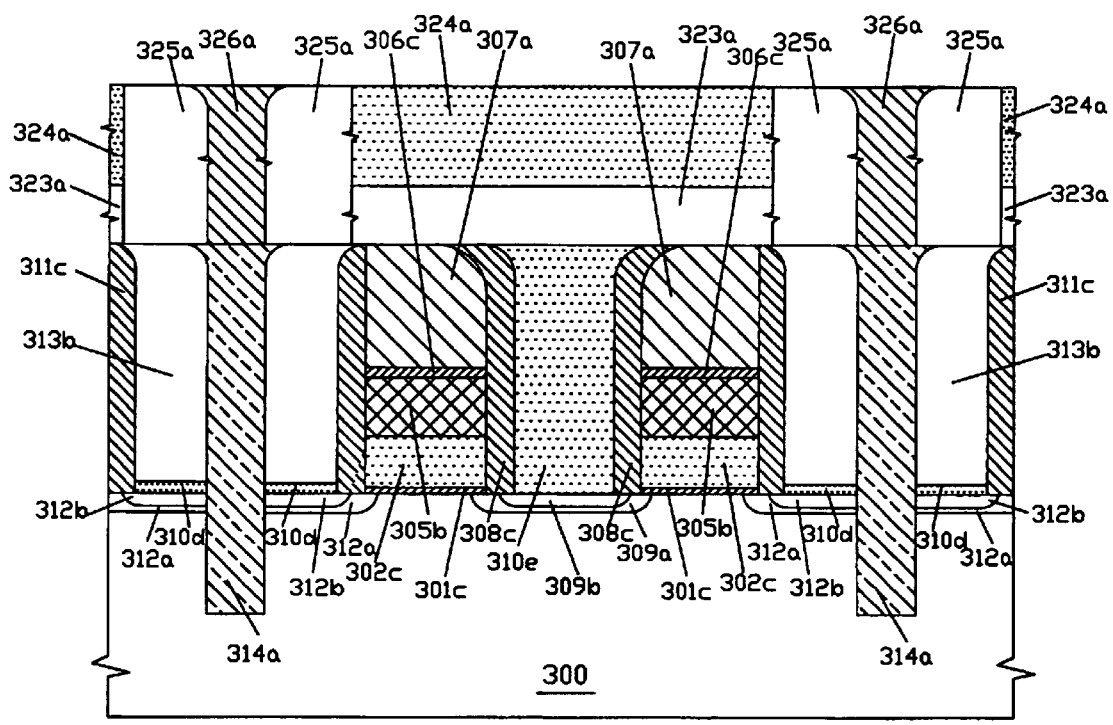

FIG. 5B shows that the first interlayer-conductive layer 324 and the first interlayer-dielectric layer 323 outside of the plurality of masking photoresist PR2(b)-1 are sequentially removed by anisotropic dry etching to form the plurality of common-source trenches and the plurality of masking photoresist PR2(b)-1 are stripped; a pair of fourth sidewall dielectric spacers 325a are formed over each sidewall of the plurality of common-source trenches, and then a third planarized dielectric layer 326a is formed between the pair of fourth sidewall dielectric spacers 325a and on the first planarized dielectric layer 314a in each of the plurality of common-source trenches. The fourth sidewall dielectric spacer 325a is preferably made of doped-oxide or silicon-oxide as deposited by LPCVD and its spacer width is preferably equal to or slightly larger than that of the third sidewall dielectric spacer 313a. The third planarized dielectric layer 326a is preferably made of silicon-oxynitride or silicon-nitride as deposited by LPCVD. It should be noted that the first interlayer-conductive layer 324 and the first interlayer-dielectric layer 323 can be replaced by a first interlayer-conductive layer, a first interlayer-dielectric layer, or a composite interlayer-dielectric layer.

Figure 5C:
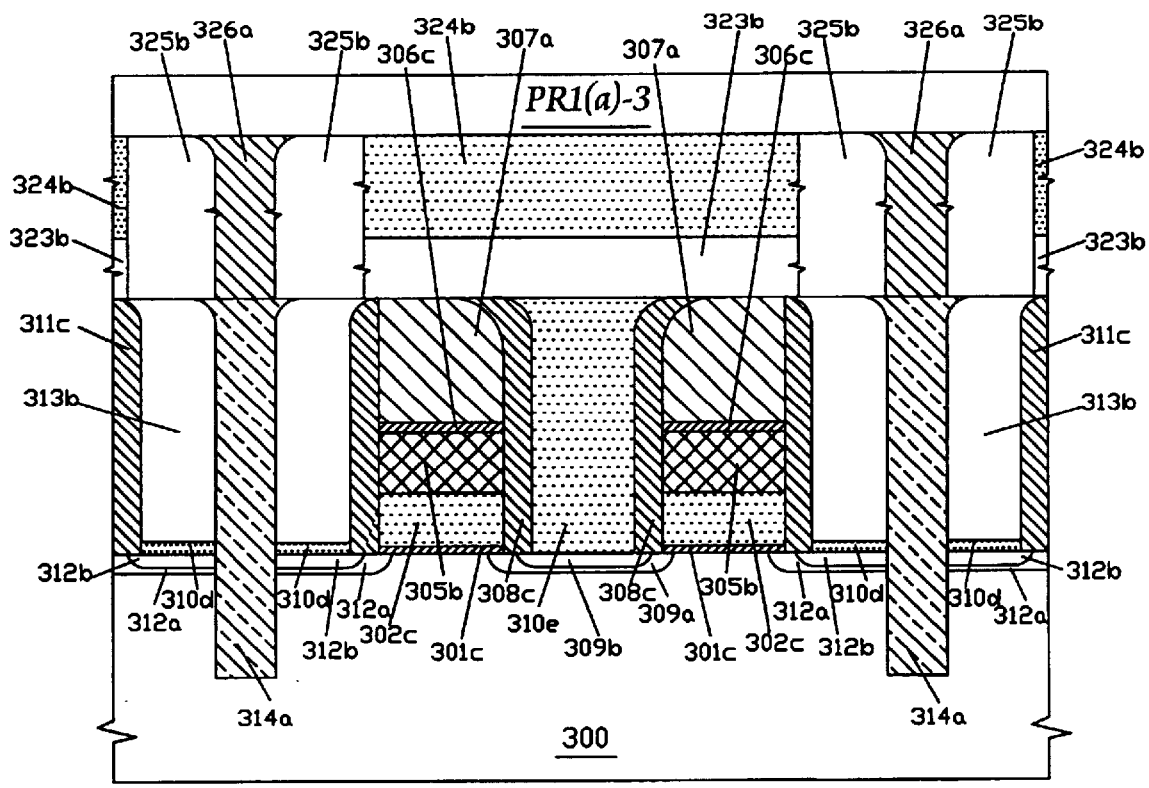

FIG. 5C shows a plurality of masking photoresist PR1(a)-3 being aligned to the plurality of active regions are formed over the formed structure shown in FIG. 5B, and the first interlayer-conductive layers 324a, the first interlayer-dielectric layers 323a, and the fourth sidewall dielectric spacers 325a outside of the plurality of masking photoresist PR1(a)-3 are sequentially removed by using anisotropic dry etching to form first interlayer-conductive islands 324b, first interlayer-dielectric islands 323b, and fourth sidewall dielectric-spacer islands 325b. The plurality of masking photoresist PR1(a)-3 can be patterned by the same photo-mask used to form the plurality of masking photoresist PR1.

Figure 5D:
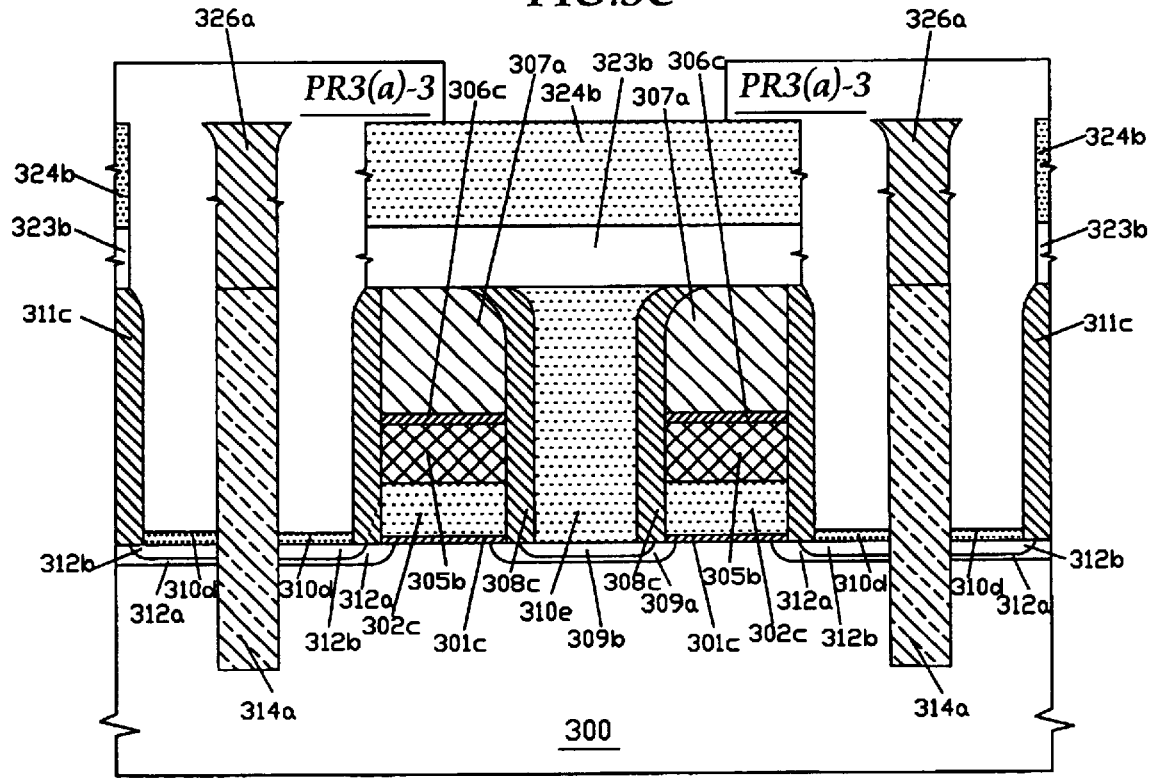

FIG. 5D shows that the plurality of masking photoresist PR1(a)-3 are stripped and a fourth planarized dielectric layer 326b is formed to fill up each gap formed between the plurality of active regions; the fourth sidewall dielectric-spacer islands 325b and the third sidewall dielectric-spacer islands 313b are first etched by anisotropic dry etching and then removed by wet etching to form the rectangular tube-shaped cavity over each of the thin fourth conductive islands 310d, and a plurality of masking photoresist PR3(a)-3 are formed over the formed structure to pattern the first interlayer-conductive islands 324b and the first interlayer-dielectric islands 323b. The plurality of masking photoresist PR3(a)-3 can be patterned by the same mask used to pattern the plurality of masking photoresist PR3(a)-1.

Figure 5E:
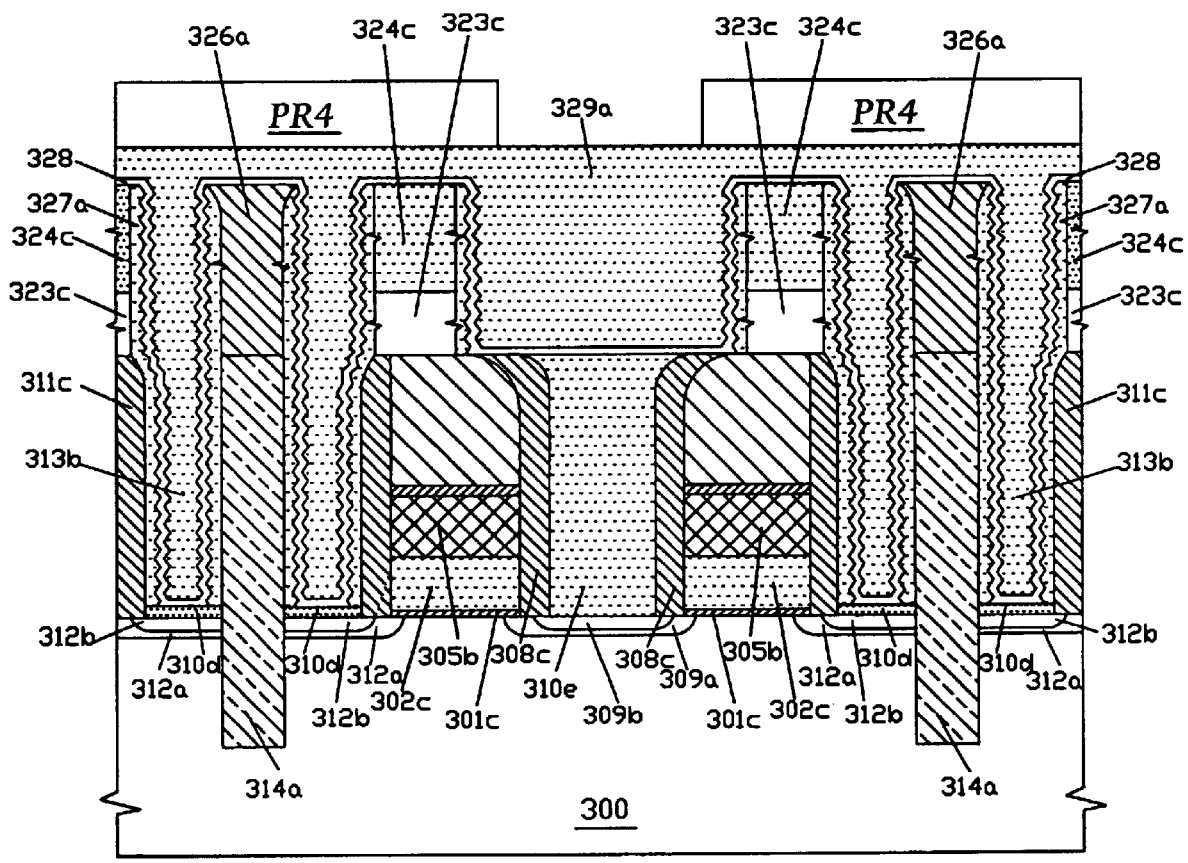

FIG. 5E shows that the first interlayer-conductive islands 324b and the first interlayer-dielectric island 323b outside of the plurality masking photoresist PR3(a)-3 are selectively removed by using anisotropic dry etching and the plurality of masking photoresist PR3(a)-3 are stripped; a fifth conductive layer 327 is formed over the whole structure and is then etched back to a thickness of the fifth conductive layer 327 to form sidewall fifth conductive layers 327a; a capacitor-dielectric layer 328 is then formed over the whole structure and a planarized sixth conductive layer 329a or a sixth conductive layer 329 (not shown) is formed over the capacitor-dielectric layer 328, and a plurality of masking photoresist PR4 are formed over the planarized sixth conductive layer 329a or the sixth conductive layer 329 to define a plurality of capacitor 329b. The fifth conductive layer 327 is preferably a doped or undoped polycrystalline-silicon layer or is preferably a rugged polycrystalline-silicon layer such as a hemispherical-grain (HSG) polycrystalline-silicon or cylindrical-grain polycrystalline-silicon layer. The capacitor-dielectric layer 328 is preferably a composite dielectric layer such as an oxide-nitride-oxide (ONO) structure or a nitride-oxide structure or is preferably a high dielectric-constant insulator. The planarized sixth conductive layer 329a or the sixth conductive layer 329 is preferably made of doped polycrystalline-silicon or doped polycrystalline-silicon capped with a refractory meal-silicide layer.

Figure 5F:
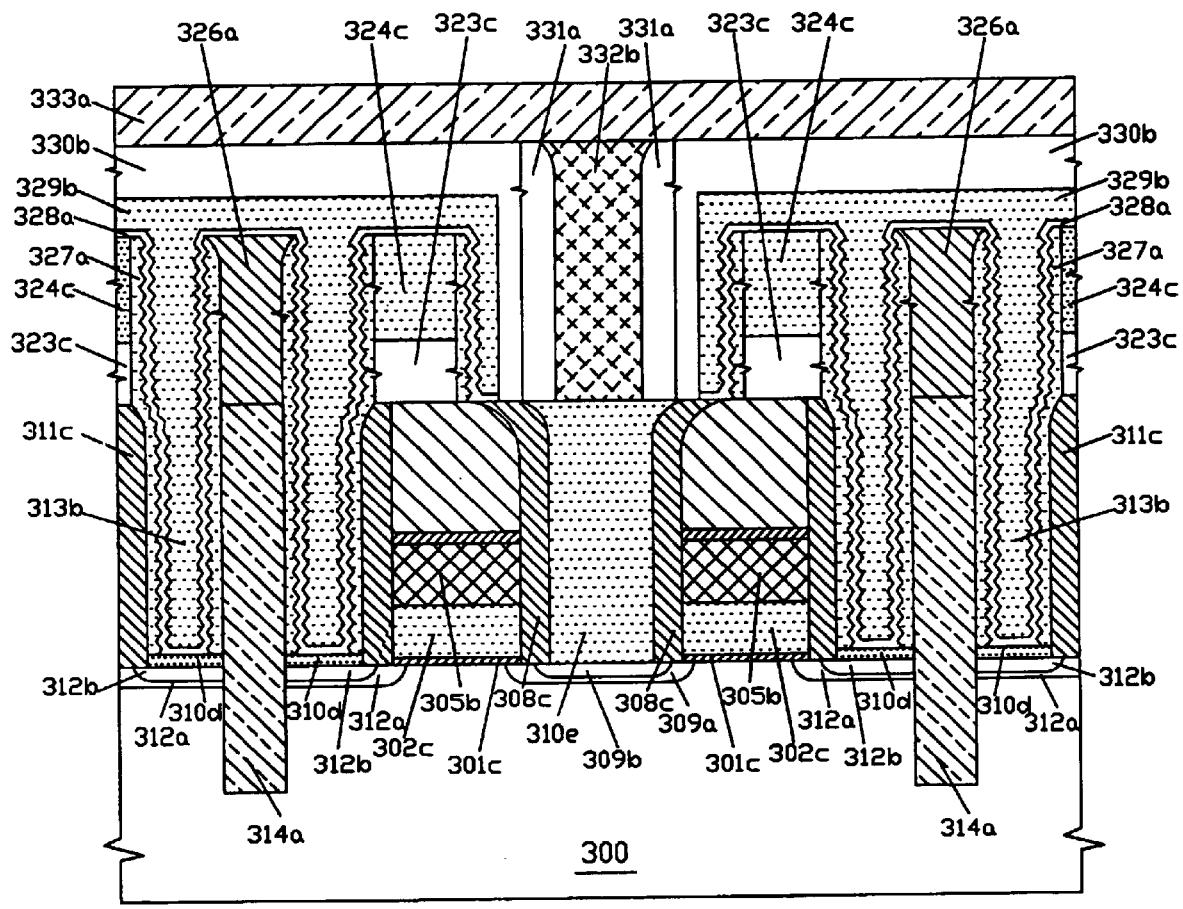

FIG. 5F shows the planarized sixth conductive layer 329a or the sixth conductive layer 329 outside of the plurality of masking photoresist PR4 is selectively removed by anisotropic dry etching, and a planarized second interlayer-dielectric layer 330a is formed over the whole structure and is patterned by a plurality of masking photoresist PR5 (not shown) to form a plurality of drain-contact trenches over each of the common-drain regions; a pair of sidewall dielectric spacers 331a are formed over each sidewall of the drain-contact trenches and a planarized first metal layer 332a is formed between the pair of sidewall dielectric spacers 331a and on the planarized third conductive islands 310e without the capping poly-oxide layers or with the capping poly-oxide layers being removed and the second planarized dielectric layers; a second metal layer 333 is formed over the planarized second interlayer-dielectric layer 330b, the pair of sidewall dielectric spacers 331a, and the planarized first metal layers 332a; a plurality of masking photoresist PR1(a)-4 (not shown) being aligned to the plurality of active regions are then formed over the second metal layer 333, and the second metal layer 333 and the planarized first metal layers 332a outside of the plurality of masking photoresist PR1(a)-4 are removed by anisotropic dry etching to form a plurality of bit lines 333a integrated with a plurality of planarized first metal islands 332b. The planarized second interlayer-dielectric layer 330a is preferably made of silicon-oxide, P-glass, or BP-glass as deposited by HDPCVD or PECVD. The sidewall dielectric spacer 331a is preferably made of silicon-oxide or silicon-nitride as deposited by LPCVD. The planarized first metal layer 332a is preferably a planarized tungsten (W) layer lined with a barrier-metal layer such as a titanium-nitride (TiN) or tantalum-nitride (TaN) layer. The second metal layer 333 is preferably made of aluminum or copper. The plurality of masking photoresist PR1(a)-4 can be patterned by using the same photo-mask used to pattern the plurality of masking photoresist PR1.

It should be noted that the planarized first metal island 332b being formed over the planarized third conductive island 310e is formed without opening a contact-hole through the planarized second interlayer-dielectric layer 330a, so the aspect-ratio effect of the contact-hole is eliminated. Similarly, a plurality of contact holes can be opened through the planarized second interlayer-dielectric layer 330a and a plurality of planarized conductive contact-plugs are then formed to fill up the plurality of contact-holes by using the well-known art.

Accordingly, the features and the advantages of the scalable DRAM transistor structure and the scalable DRAM capacitor structure of the present invention are summarized below:

(a) The scalable DRAM transistor structure of the present invention being formed by the spacer-formation techniques without a dummy-transistor structure can be easily scaled to optimize each surface area of DRAM components.
(b) The scalable DRAM transistor structure of the present invention can offer a cell size smaller than $6F^2$ for a scalable DRAM cell.
(c) The scalable DRAM transistor structure of the present invention offers a planarized third conductive island over each of the common-drain diffusion regions and a thin fourth conductive island over each of the source diffusion regions to improve the contact resistance and the contact integrity.
(d) The scalable DRAM transistor structure of the present invention offers a composite first/second sidewall dielectric spacer including a first/second buffer-dielectric layer and a first/second sidewall dielectric spacer for forming a shallow heavily-doped source/drain diffusion region within a lightly-doped source/drain diffusion region to alleviate the punch-through effect and the hot-electron reliability and to reduce the overlapping capacitance between the conductive-gate layer and the lightly-doped source/drain diffusion regions.
(e) The scalable DRAM capacitor structure of the present invention offers a rectangular tube-shaped cavity over each of the thin fourth conductive islands for forming a high-capacity DRAM capacitor.
(f) The scalable DRAM capacitor structure of the present invention offers a contactless structure for forming a bit-line node.

While the present invention has been particularly shown and described with reference to the present examples and embodiments as considered as illustrative and not restrictive. Moreover, the present invention is not to be limited to the details given herein, it will be understood by those skilled in the art that various changes in form and details may be made with departure from the true spirit and scope of the invention.

What is claimed is:

1. A scalable DRAM transistor structure comprising:
   a semiconductor substrate of a first conductivity type;
   a shallow-trench-isolation (STI) structure having an active region sandwiched by two parallel STI regions being formed on said semiconductor substrate;
   a transistor-stack being formed transversely across a portion of said active region and said two parallel STI regions, wherein said transistor-stack comprises a masking sidewall dielectric spacer over a capping-dielectric layer being formed on an elongated second conductive layer with said elongated second conductive layer formed on a first conductive layer over a gate-dielectric layer in said active region and over two first raised field-oxide layers in said two parallel STI regions;
   a common-drain region being located in one side portion of said transistor-stack comprising: a composite first sidewall dielectric spacer being formed over one sidewall of said transistor-stack and on a portion of a second flat bed being formed by two third raised field-oxide layers in said two parallel STI regions and a common-drain diffusion region of a second conductivity type in said active region, and a planarized third conductive island being formed on said common-drain diffusion region outside of said composite first sidewall dielectric spacer and between two second planarized dielectric layers being formed over said two third raised field-oxide layers in said two parallel STI regions;

a common-source region being located in another side portion of said transistor-stack comprising: two source regions and one isolation region being located between said two source regions, wherein said isolation region comprises a self-aligned shallow trench being formed in said semiconductor substrate of said active region to electrically isolate said two source regions with a first planarized dielectric layer being formed over said self-aligned shallow trench in said active region and on said two third raised field-oxide layers in said two parallel STI regions; and said source region being formed near said transistor-stack comprising:

a composite second sidewall dielectric spacer being formed over another sidewall of said transistor-stack and on a portion of a first flat bed being formed by a source diffusion region of said second conductivity type in said active region and said two third raised field-oxide layers in said two parallel STI regions, a thin fourth conductive island being formed on said source diffusion region between said composite second sidewall dielectric spacer and said first planarized dielectric layer, and a third sidewall dielectric-spacer island being formed on said thin fourth conductive island in said active region and between said two second planarized dielectric layers in said two parallel STI regions.

2. The scalable DRAM transistor structure according to claim 1, wherein said composite first/second sidewall dielectric spacer being made of silicon-nitride comprises a first/second buffer-dielectric layer for forming a lightly-doped common-drain/source diffusion region of said second conductivity type and a first/second sidewall dielectric spacer being formed over one/another sidewall of said first/second buffer-dielectric layer for forming a shallow heavily-doped common-drain/source diffusion region of said second conductivity type within said lightly-doped common-drain/source diffusion region.

3. The scalable DRAM transistor structure according to claim 1, wherein said masking sidewall dielectric spacer being made of silicon-nitride is used as a hard mask to pattern said transistor-stack and to simultaneously define said common-drain region.

4. The scalable DRAM transistor structure according to claim 1, wherein said first planarized dielectric layer and said second planarized dielectric layer are preferably made of silicon-oxynitride or silicon-oxide.

5. The scalable DRAM transistor structure according to claim 1, wherein said third sidewall dielectric-spacer island being preferably made of doped oxide is formed by patterning a third sidewall dielectric spacer and said third sidewall dielectric spacer is used as a hard mask to simultaneously define said self-aligned shallow trench and said source region for forming said first planarized dielectric layer and said thin fourth conductive island, and can be selectively removed to form a rectangular tube-shaped cavity over said thin fourth conductive island for forming a scalable DRAM capacitor structure.

6. The scalable DRAM transistor structure according to claim 5, wherein said scalable DRAM capacitor structure comprises:

said rectangular tube-shaped cavity having a first-side formed by said composite second sidewall dielectric spacer, a second side formed by said first planarized dielectric layer, and a third-side and a fourth-side formed separately by said second planarized dielectric layer;

a sidewall fifth conductive layer being formed over an inner sidewall of said rectangular tube-shaped cavity together with said thin fourth conductive island to act as a source plate;

a capacitor-dielectric layer of a high dielectric-constant being at least formed over said sidewall fifth conductive layer and said thin fourth conductive island;

a planarized sixth conductive layer or a sixth conductive layer being formed over said capacitor-dielectric layer and patterned to act as a capacitor plate;

a planarized conductive contact-plug or a planarized conductive contact-island being formed on said planarized third conductive island to act as a bit-line node; and a metal layer being patterned to be aligned above said active region and connected with said planarized conductive contact-plug or said planarized conductive contact-island to act as a bit line.

7. The scalable DRAM transistor structure according to claim 5, wherein said scalable DRAM capacitor structure comprises:

said rectangular tube-shaped cavity having a first-side formed by said composite second sidewall dielectric spacer and a first interlayer island being at least formed on a portion of said transistor-stack in said active region, a second side formed by a third planarized dielectric layer being formed on said first planarized dielectric layer, and a third side and a fourth-side formed separately by a fourth planarized dielectric layer on said second planarized dielectric layer;

a sidewall fifth conductive layer being at least formed over an inner sidewall of said rectangular tube-shaped cavity together with said thin fourth conductive island to act as a source plate;

a capacitor-dielectric layer being at least formed over said thin fourth conductive island and said sidewall fifth conductive layer;

a sixth conductive layer or a planarized sixth conductive layer being formed over said capacitor-dielectric layer and patterned to act as a capacitor plate;

a planarized conductive contact-plug or a planarized conductive contact-island being formed on said planarized third conductive island to act as a bit-line node; and a metal layer being patterned to be aligned above said active region and connected with said planarized conductive contact-plug or said planarized conductive contact-island to act as a bit line.

8. The scalable DRAM transistor structure according to claim 7, wherein said first interlayer island comprises a first interlayer-conductive island on a first interlayer-dielectric island, a first interlayer-conductive island, a first interlayer-dielectric island, or a composite interlayer-dielectric island.

9. The scalable DRAM transistor structure according to claim 7, wherein said third planarized dielectric layer and said fourth planarized dielectric layer are preferably made of silicon-nitride or silicon-oxynitride.

10. A scalable DRAM memory structure comprising:

a scalable DRAM transistor structure being formed over a shallow-trench-isolation (STI) structure having an active region isolated by two parallel STI regions formed on a semiconductor substrate of a first conductivity type, wherein a transistor-stack comprising an elongated second conductive layer having a masking sidewall dielectric spacer over a capping-dielectric layer formed thereon is formed over a flat surface being formed by a first conductive layer over a gate-dielectric layer in said active region and over two first raised field-oxide layers in said two parallel STI regions; a common-drain region being located in one side portion of said transistor-stack comprises: a composite first sidewall dielectric spacer being formed over one sidewall of said transistor-stack and on a portion of a second flat bed being formed by two third raised field-oxide layers in said two parallel STI regions and a common-drain diffusion region of a second conductivity type in said active region, and a planarized third conductive island being formed on said common-drain diffusion region outside of said composite first sidewall dielectric spacer and between two second planarized dielectric layers being formed over said two third raised field-oxide layers in said two parallel STI regions; and a source region being located in another side portion of said transistor-stack comprises: a composite second sidewall dielectric spacer being formed over another sidewall of said transistor-stack and on a portion of a first flat bed being formed by a source diffusion region of said second conductivity type in said active region and said two third raised field-oxide layers in said two parallel STI regions, a thin fourth conductive island being formed on said source diffusion region between said composite second sidewall dielectric spacer and a first planarized dielectric layer, and a third sidewall dielectric-spacer island being formed on said thin fourth conductive island in said active region and between said two second planarized dielectric layers in said two parallel STI regions;

a rectangular tube-shaped cavity being formed over said thin fourth conductive island;

a sidewall fifth conductive layer being at least formed over an inner sidewall of said rectangular tube-shaped cavity together with said thin fourth conductive island to act as a source plate;

a capacitor-dielectric layer being at least formed over said thin fourth conductive island and said sidewall fifth conductive layer;

a planarized sixth conductive layer or a sixth conductive layer being formed over said capacitor-dielectric layer and patterned to act as a capacitor plate;

a planarized conductive contact-plug or a planarized conductive contact-island being formed on said planarized third conductive island to act as a bit-line node; and a metal layer being patterned to be aligned above said active region and connected with said planarized conductive contact-plug or said planarized conductive contact-island to act as a bit line.

11. The scalable DRAM memory structure according to claim 10, wherein said rectangular tube-shaped cavity comprises:

first side being formed by said composite second sidewall dielectric spacer;

a second side being formed by said first planarized dielectric layer; and a third side and a fourth side being separately formed by said second planarized dielectric layer.

12. The scalable DRAM memory structure according to claim 10, wherein said rectangular tube-shaped cavity comprises:

a first side being formed by said composite second sidewall dielectric spacer and a first interlayer island being at least formed on a portion of said transistor-stack in said active region;

a second side being formed by said third planarized dielectric layer formed on said first planarized dielectric layer; and a third side and a fourth side being separately formed by said fourth planarized dielectric layer formed on said second planarized dielectric layer.

13. The sealable DRAM memory structure according to claim 12, wherein said first interlayer island comprises a first interlayer-conductive island on a first interlayer-dielectric island, a first interlayer-dielectric island, a first interlayer-conductive island, or a composite interlayer-dielectric island.

14. The scalable DRAM memory structure according to claim 10, wherein said masking sidewall dielectric spacer being preferably made of silicon-nitride is used as a hard mask to pattern said transistor-stack and to simultaneously define said common-drain region.

15. The scalable DRAM memory structure according to claim 10, wherein said composite first/second sidewall dielectric spacer being preferably made of silicon-nitride comprises a first/second buffer-dielectric layer for forming a lightly-doped common-drain/source diffusion region of said second conductivity type and a first/second sidewall dielectric spacer being formed over one/another sidewall of said first/second buffer-dielectric layer for forming a shallow heavily-doped common-drain/source diffusion region of said second conductivity type within said lightly-doped common-drain/source diffusion region.

16. The scalable DRAM memory structure according to claim 10, wherein said third sidewall dielectric-spacer island being preferably made of doped oxide is formed by patterning a third side wall dielectric spacer and said third sidewall dielectric spacer is used as a hard mask to simultaneously define said self-aligned shallow trench and said source region for forming said first planarized dielectric layer and said thin fourth conductive island.

* * * * *